US012669733B2

(12) United States Patent
Uchida et al.

(10) Patent No.: US 12,669,733 B2
(45) Date of Patent: Jun. 30, 2026

(54) ACTIVE MATRIX SUBSTRATE, METHOD FOR MANUFACTURING SAME, AND LIQUID CRYSTAL DISPLAY DEVICE

(71) Applicant: Sharp Display Technology Corporation, Kameyama City (JP)

(72) Inventors: Seiichi Uchida, Kameyama City (JP); Kuniaki Okada, Kameyama City (JP); Hiromi Katoh, Kameyama City (JP); Keisuke Yoshida, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 380 days.

(21) Appl. No.: 18/433,752

(22) Filed: Feb. 6, 2024

(65) Prior Publication Data

US 2024/0295787 A1 Sep. 5, 2024

(30) Foreign Application Priority Data

Mar. 3, 2023 (JP) ................................. 2023-032765

(51) Int. Cl.
| | |
|---|---|
| *G02F 1/1368* | (2006.01) |
| *G02F 1/1362* | (2006.01) |
| *H10D 86/40* | (2025.01) |
| *H10D 86/60* | (2025.01) |

(52) U.S. Cl.
CPC ...... *G02F 1/1368* (2013.01); *G02F 1/136209* (2013.01); *G02F 1/136222* (2021.01); *G02F 1/136227* (2013.01); *H10D 86/441* (2025.01); *H10D 86/451* (2025.01); *H10D 86/60* (2025.01)

(58) Field of Classification Search
CPC .......................... G02F 1/1368; G02F 1/136209
USPC .......................................................... 257/59
See application file for complete search history.

(56) References Cited

U.S. PATENT DOCUMENTS

| | | |
|---|---|---|
| 2003/0133059 A1 | 7/2003 | Wei et al. |
| 2019/0187522 A1 | 6/2019 | Katayama et al. |
| 2022/0163857 A1 | 5/2022 | Watanabe |
| 2023/0194939 A1 | 6/2023 | Watanabe |

FOREIGN PATENT DOCUMENTS

| | | |
|---|---|---|
| JP | 2003-215639 A | 7/2003 |
| JP | 2019-113584 A | 7/2019 |
| JP | 2022-084146 A | 6/2022 |

*Primary Examiner* — Ajay Arora
(74) *Attorney, Agent, or Firm* — ScienBiziP, P.C.

(57) ABSTRACT

An active matrix substrate includes: a support substrate; and a plurality of pixels located on the support substrate, in which each of the plurality of pixels includes: a thin film transistor; a first color filter layer; a contact hole provided in the first color filter layer; and a pixel electrode electrically coupled to the thin film transistor through the contact hole, and has a second color filter layer in the contact hole, the plurality of pixels include a first pixel, and in the first pixel, the first color filter layer transmits light in a first wavelength band and the second color filter layer transmits the light in the first wavelength band or transmits either the light in the first wavelength band or another light when a layer for transmitting the other light is provided around the contact hole.

14 Claims, 19 Drawing Sheets

(OBSERVATION SURFACE SIDE)

(REAR SURFACE SIDE)

ACTIVE MATRIX SUBSTRATE, METHOD FOR MANUFACTURING SAME, AND LIQUID CRYSTAL DISPLAY DEVICE

BACKGROUND

1. Field

The following disclosure relates to an active matrix substrate, a method for manufacturing the same, and a liquid crystal display device.

2. Description of the Related Art

An active matrix substrate using an active element, which is represented by a thin film transistor (TFT), is widely used for various applications such as a liquid crystal display device. As the liquid crystal display device, for example, a device having a structure in which a liquid crystal layer is sandwiched between an active matrix substrate and a counter substrate including color filters has been known.

In recent years, it has been demanded for the liquid crystal display device to have higher resolution (that is, higher definition). However, since the high-definition liquid crystal display device has an area per pixel that is smaller than the low-definition liquid crystal display device, it is demanded to align positions of the color filters disposed on the counter substrate and pixels on the active matrix substrate with high precision, which has been a problem. As one method for suppressing positional deviation, for example, a liquid crystal display device having a color filter on array (COA) structure in which color filters are disposed on an active matrix substrate has been proposed. For example, Japanese Unexamined Patent Application Publication Nos. 2022-084146 and 2003-215639 disclose a liquid crystal display device having a COA structure.

The liquid crystal display device disclosed in Japanese Unexamined Patent Application Publication No. 2022-084146 has a contact hole provided on an organic insulating layer that covers a switching element and the like to couple the switching element and a pixel electrode, has metal wiring and a filling member disposed inside the contact hole, and a resin layer disposed at a position overlapping the contact hole. The metal wiring or resin layer has a role as a light shielding layer that shields the contact hole. In the liquid crystal display device, since oblique light passing through the contact hole is shielded by the light shielding layer, there is a problem that a pixel aperture ratio in an oblique direction is reduced. In particular, the high-definition liquid crystal display device has small pixels as described above, but when the pixels are small, the pixel aperture ratio is also reduced, so that a problem of the pixel aperture ratio becomes remarkable. In addition, improvement is also desired in terms of manufacturing efficiency because a process of disposing the metal wiring during manufacturing is demanded.

Japanese Unexamined Patent Application Publication No. 2003-215639 (for example, see FIGS. 4 and 5) discloses a liquid crystal display device having a configuration in which a protective layer covering a TFT and an overcoat layer are provided with contact holes that electrically couple the TFT and a reflective electrode, and a color filter layer is formed on the reflective electrode. The device has a structure in which the overcoat layer formed of a color filter material and a color filter layer disposed on the reflective electrode are laminated, and the color filter layer is also disposed on a transmission portion. Therefore, in order to dispose a transparent electrode on an uppermost portion of the color filter layer, it is demanded to form a hole in the color filter layer and couple the transparent electrode to the reflective electrode through the hole. However, it is considered that a tinge of light changes and the chromaticity is shifted due to the presence of the hole.

Further, Japanese Unexamined Patent Application Publication No. 2003-215639 (for example, see FIG. 6 and the like) discloses a liquid crystal display device having a configuration in which a protective layer covering a TFT is provided with contact holes that electrically couple the TFT and a transparent electrode, and a color filter layer having a space for exposing the contact holes is formed on the protective layer. However, it is considered that a tinge of light passing through the space changes, resulting in a change of a tinge of the display.

The present disclosure has been made in view of the above circumstances, and it is desirable to provide an active matrix substrate including a COA structure, having a high pixel aperture ratio, and sufficiently suppressing a change of a tinge of a display, and a method for manufacturing the same. In addition, according to the present disclosure, it is desirable to provide a liquid crystal display device including the active matrix substrate and a head mounted display device.

SUMMARY

According to one embodiment of the present disclosure, there is provided an active matrix substrate including: a support substrate; and a plurality of pixels located on the support substrate, in which each of the plurality of pixels includes: a thin film transistor; a first color filter layer; a contact hole provided in the first color filter layer; and a pixel electrode electrically coupled to the thin film transistor through the contact hole, and has a second color filter layer in the contact hole, the plurality of pixels include a first pixel, and in the first pixel, the first color filter layer transmits light in a first wavelength band and the second color filter layer transmits the light in the first wavelength band or transmits either the light in the first wavelength band or another light when a layer for transmitting the other light is provided around the contact hole.

According to another embodiment of the present disclosure, there is provided a liquid crystal display device including: the above active matrix substrate, a counter substrate; and a liquid crystal layer located between the active matrix substrate and the counter substrate.

According to still another embodiment of the present disclosure, there is provided a head mounted display device including: the above active matrix substrate, a counter substrate; and a liquid crystal layer located between the active matrix substrate and the counter substrate.

According to still another embodiment of the present disclosure, there is provided a method for manufacturing the above active matrix substrate, which is performed in each of a plurality of pixel regions, the method including, in order: (1) forming a thin film transistor; (2) forming a first color filter layer having a contact hole; (3) forming a pixel electrode; and (4) forming a second color filter layer in the contact hole.

BRIEF DESCRIPTION OF THE DRAWINGS

FIG. 3 is an enlarged schematic plan view illustrating a part of pixels of the liquid crystal panel including the active matrix substrate according to the example of Embodiment 1 and the like;

FIG. 4 is a cross-sectional view taken along line A-A' in FIG. 3 as a cut surface (cross-sectional view taken along line A-A');

DESCRIPTION OF THE EMBODIMENTS

Definition of Terms

Figure 1:
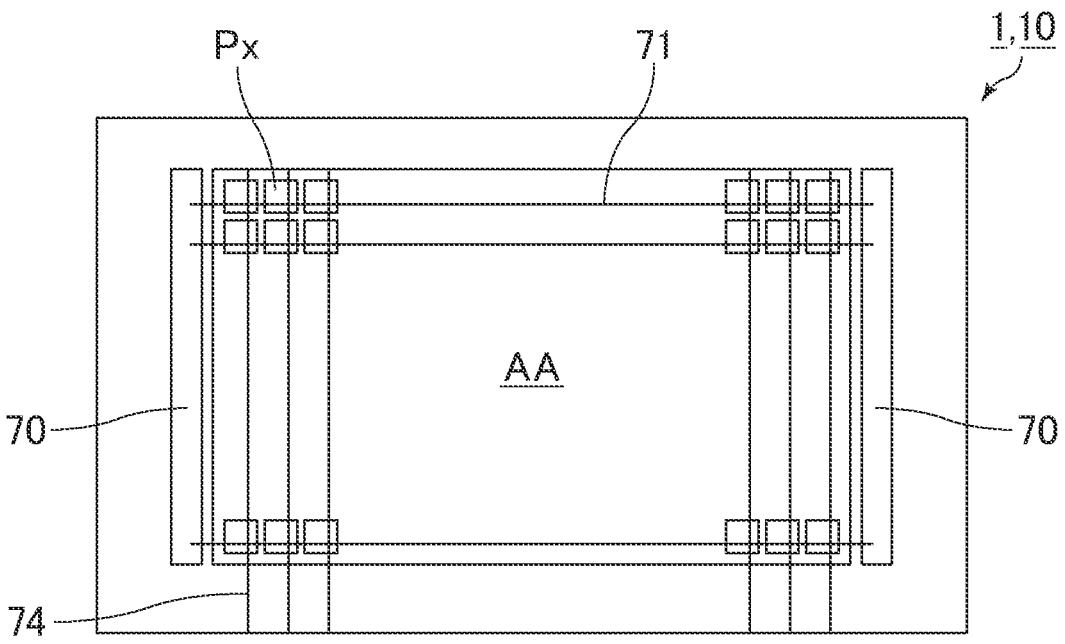
FIG. 1 is a schematic plan view of an entire active matrix substrate according to an example of Embodiment 1 when viewed from an observation surface side.

The term "observation surface side" herein means a side closer to a screen (display surface) of a liquid crystal display device, and the term "rear surface side" herein means a side farther than the screen (display surface) of the liquid crystal display device.

The term "visible light" means light having a wavelength of 380 nm or greater and less than 800 nm. The term "light-transmitting property" means a property of transmitting at least visible light.

Hereinafter, embodiments of the present disclosure will be described. The present disclosure is not limited to the contents described in the following embodiments, and design changes can be made as appropriate within the scope of satisfying a configuration of the present disclosure. For better understanding of a specific aspect as an example described in each embodiment (or example), in the drawings, (R), (G), and (B), which means red, green, and blue, are added to the ending of the words of reference signs that indicate color filter layers, respectively.

Embodiment 1

FIG. 1 is a schematic plan view of an entire active matrix substrate 10 according to an example of the present embodiment when viewed from an observation surface side. The active matrix substrate 10 is used in combination of a counter substrate 30 to be described below, and a portion or a structure body, which has a structure in which a liquid crystal layer 20 is sandwiched between the active matrix substrate 10 and the counter substrate 30, is referred to as a liquid crystal panel. A liquid crystal panel 1, which includes the active matrix substrate 10 of the present disclosure, the liquid crystal layer 20, and the counter substrate 30, is also one of the disclosures found by present inventors.

Figure 2:
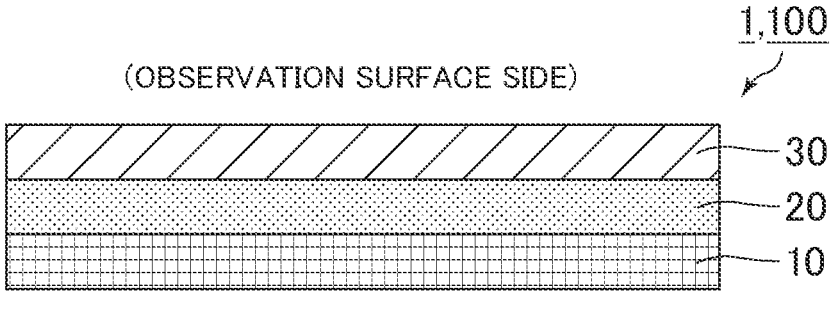
FIG. 2 is a schematic cross-sectional view of a liquid crystal panel including the active matrix substrate according to the example of Embodiment 1.
Figures 3, 4:
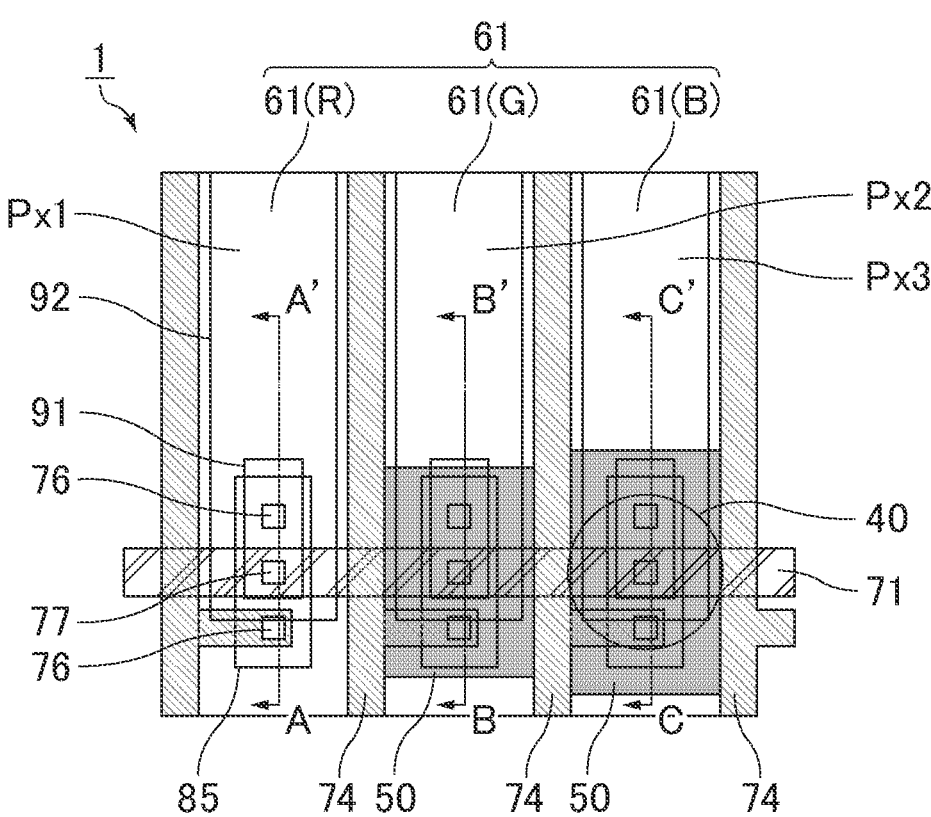
Figure 5:
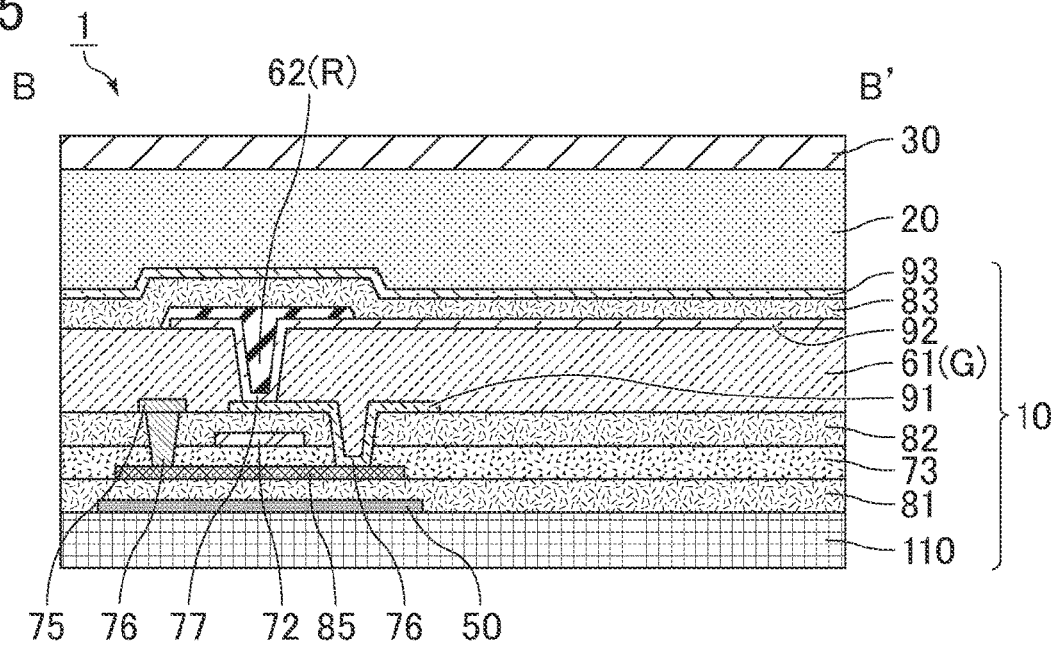
FIG. 5 is a cross-sectional view taken along line B-B' in FIG. 3 as a cut surface (cross-sectional view taken along line B-B')
Figure 6:
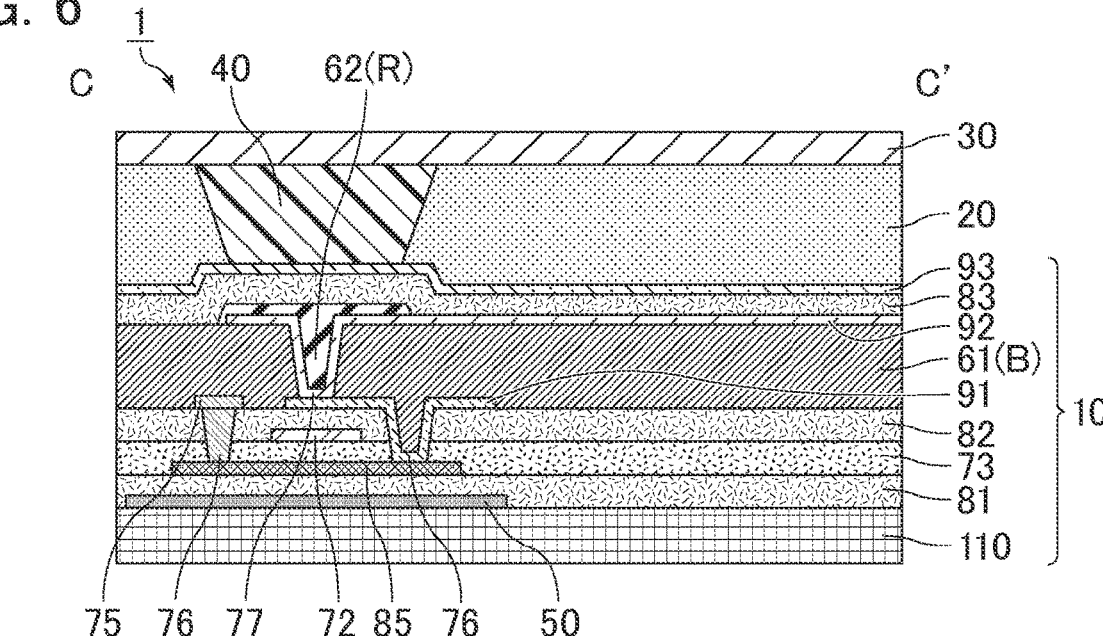
FIG. 6 is a cross-sectional view taken along line C-C' in FIG. 3 as a cut surface (cross-sectional view taken along line C-C')

FIG. 2 is a schematic cross-sectional view of the liquid crystal panel 1 including the active matrix substrate 10 according to the example of the present embodiment. FIG. 3 is an enlarged schematic plan view of a part of pixels of the liquid crystal panel 1. The part of pixels of the liquid crystal panel 1 is simplified in FIG. 3. FIG. 4 is a cross-sectional view taken along line A-A' in FIG. 3 as a cut surface (cross-sectional view taken along line A-A'), and corresponds to a cross-sectional view of a first pixel Px1 (red pixel in the present embodiment). FIG. 5 is a cross-sectional view taken along line B-B' in FIG. 3 as a cut surface (cross-sectional view taken along line B-B'), and corresponds to a cross-sectional view of a second pixel Px2 (green pixel in the present embodiment). FIG. 6 is a cross-sectional view taken along line C-C' in FIG. 3 as a cut surface (cross-sectional view taken along line C-C'), and corresponds to a cross-sectional view of a third pixel Px3 (blue pixel in the present embodiment).

The active matrix substrate 10 includes a support substrate 110 and a plurality of pixels Px located on the support substrate 110. As illustrated in FIG. 1, gate drivers 70 are disposed on both sides (left and right sides in FIG. 1) of a display portion AA located in the center of the support substrate 110. In this case, the gate drivers 70 are disposed on both sides of the display portion AA, but may be disposed on one of the left and right. The display portion AA includes a plurality of source lines (signal lines) 74 disposed in parallel with each other along a column direction (vertical direction in FIG. 1), and a plurality of gate lines (scanning lines) 71 disposed in parallel with each other along a row direction (transverse direction in FIG. 1) to intersect perpendicularly with the respective source lines 74. The plurality of source lines 74 and the plurality of gate lines 71 are formed in a matrix (lattice) as a whole so as to partition each pixel. A region surrounded by a lattice-shaped minimum unit, that is, the source line 74 and the gate line 71 is referred to as a "pixel", and is also referred to as a sub pixel. In each pixel Px, a TFT serving as a switching element is disposed at an intersection of the source line 74 and the gate line 71. The TFT is an element including a gate electrode 72, a source electrode 75, and a semiconductor film 85.

The liquid crystal panel 1 includes the active matrix substrate 10, the liquid crystal layer 20, and the counter substrate 30. That is, the liquid crystal panel 1 has a structure in which the liquid crystal layer 20 is sandwiched between the active matrix substrate 10 and the counter substrate 30 facing each other. For example, as illustrated in FIG. 2, the active matrix substrate 10, the liquid crystal layer 20, and the counter substrate 30 are disposed in order from the rear surface side to the observation surface side. The liquid crystal layer 20 is generally sealed with a sealant (not illustrated) between the active matrix substrate 10 and the counter substrate 30. An alignment film (not illustrated) is disposed on the active matrix substrate 10 and a surface of the counter substrate 30 in contact with the liquid crystal layer 20, as demanded.

In the active matrix substrate 10, a plurality of pixels Px are disposed on the support substrate 110. Each of the plurality of pixels Px includes at least a TFT, a first color filter layer 61, a contact hole (referred to as a second contact hole) 77 provided in the first color filter layer 61, and a pixel electrode 92 electrically coupled to the TFT through a second contact hole 77. The second color filter layer 62 is formed in the second contact hole 77.

More specifically, for example, as illustrated in FIGS. 1 and 3 to 6, the source line 74 overlaps a semiconductor portion (also referred to as a semiconductor film) 85 of the TFT through the first contact hole 76, and the overlapping portion thereof is the source electrode 75 of the TFT. The gate line 71 is a gate electrode 72 of the TFT. The first contact hole 76 is provided in an end of the semiconductor film 85, and a first transparent electrode 91 is coupled through the first contact hole 76. When viewed in a cross-sectional view, the first color filter layer 61 is formed on the first transparent electrode 91, and the second contact hole 77 is formed above the first transparent electrode 91 (with the proviso that a side of the support substrate 110 is set downward). The second contact hole 77 is filled with the second color filter layer 62. The first transparent electrode 91 and the second transparent electrode 92 are electrically coupled to each other through the second contact hole 77. The second transparent electrode 92 serves as a pixel electrode. An insulating film (third insulating film 83) is formed on the second transparent electrode 92, and a third transparent electrode 93 is formed on the insulating film. The third transparent electrode 93 serves as a common electrode. An insulating film is provided between the respective layers as demanded (first, second, and third insulating films 81, 82, and 83, gate insulating film 73, and the like). In a schematic plan view (for example, FIG. 3 and the like), the third transparent electrode 93 is omitted.

The first color filter layer 61 is generally provided so as to be periodically arranged between lattices of a black matrix (also referred to as BM), and is desirably formed over the entire pixel region in each pixel Px. The first color filter layer 61 is provided with the second contact hole 77 formed through the first color filter layer 61 in a thickness direction thereof (see FIGS. 4 to 6).

As illustrated in FIGS. 4 to 6, the second contact hole 77 is located above the TFT when viewed in a cross-sectional view (with the proviso that the side of the support substrate 110 is set downward). As a result, since positional deviation when forming the second contact hole 77 is sufficiently suppressed, the reduction in the manufacturing yield due to the positional deviation is sufficiently suppressed. More specifically, the second contact hole 77 is located on the first transparent electrode 91 and exposes the first transparent electrode 91 at a bottom portion. The first transparent electrode 91 is referred to as a lead-out electrode because it has a portion that is led out from the TFT to the outside so as to overlap the gate electrode 72. The lead-out electrode 91 electrically couples the TFT and the pixel electrode (second transparent electrode) 92. The second contact hole 77 is located on the lead-out electrode 91.

An opening shape of the second contact hole 77 is not particularly limited. For example, in an example illustrated in FIG. 3, the opening shape is rectangular, but may be circular. In addition, an inclination angle α of a side surface of the second contact hole 77 with respect to a main surface of the support substrate 110 may be, for example, 45° or greater or 45° or less. The inclination angle α with respect to the main surface of the support substrate 110 means an angle when the main surface (horizontal direction) of the support substrate is set to 0°. The inclination of the side surface (referred to as a taper) may be steep or gentle as long as the inclination angle is formed without completely disconnecting the pixel electrode 92 in the second contact hole 77. As will be described below, since the second contact hole 77 is a region where light is transmitted in at least the first pixel Px1, a pixel aperture ratio can be maintained high by the small inclination angle α of the side surface (that is, the gentle inclination of the side surface) even if an opening in an upper surface of the second contact hole 77 is large. The upper surface of the second contact hole 77 means an upper surface when the side of the support substrate 110 is set downward.

As illustrated in FIGS. 4 to 6, the pixel electrode (second transparent electrode) 92 is located above the first color filter layer 61 when viewed in a cross-sectional view (with the proviso that the side of the support substrate 110 is set downward). The pixel electrode 92 is electrically coupled to the TFT through the second contact hole 77. In addition, the pixel electrode 92 is coupled to the first transparent electrode 91 through the second contact hole 77. The pixel electrode 92 covers a bottom surface and a side surface of the second contact hole 77, and forms an internal space in the second contact hole 77. The second color filter layer 62 is disposed in the internal space formed by the pixel electrode 92, that is, inside the second contact hole 77.

The insulating film and the common electrode are provided on the pixel electrode 92 when viewed in a cross-sectional view (see FIGS. 4 to 6). That is, the common electrode (third transparent electrode 93) is disposed above the pixel electrode 92 through the insulating film (third insulating film 83). With the proviso that the support substrate 110 side is set downward.

Hereinafter, a structure of each pixel and the like will be described in more detail.

In each pixel Px, the first color filter layer 61 has spectrum performance of transmitting light having a predetermined wavelength. That is, the plurality of pixels Px located on the support substrate 110 include a plurality of types of pixels having different transmission wavelength bands of the color filter layers. The plurality of pixels Px include at least the following first pixel Px1. In the present embodiment, the plurality of pixels Px include the first pixel Px1, the second pixel Px2, and the third pixel Px3 adjacent to one another. FIG. 3 illustrates the first pixel Px1, the second pixel Px2, and the third pixel Px3.

The first pixel Px1, the second pixel Px2, and the third pixel Px3 may be collectively referred to as the pixel Px when described collectively.

A wavelength band (referred to as a transmission wavelength band) of light, which is transmitted through the first color filter layer 61 of the first pixel Px1, is referred to as a "first wavelength band", a transmission wavelength band of the first color filter layer 61 of the second pixel Px2 is referred to as a "second wavelength band", and a transmission wavelength band of the first color filter layer 61 of the third pixel Px3 is referred to as a "third wavelength band".

The first, second, and third wavelength bands are different from each other.

In the present embodiment, light in the first wavelength band is referred to as light in a red wavelength band (also referred to as red light), light in the second wavelength band is referred to as light in a green wavelength band (also referred to as green light), and light in the third wavelength band is referred to as light in a blue wavelength band (also referred to as blue light). That is, the first pixel Px1 is a red pixel, the second pixel Px2 is a green pixel, and the third pixel Px3 is a blue pixel. As described above, in the present embodiment, an aspect including three types of pixels will be described, but the number of types of pixels is not limited to three, and may be two or less, or four or more. For example, the plurality of pixels Px may further include a fourth pixel Px4 having a layer for transmitting light in a fourth wavelength band, as the first color filter layer 61. The light in the fourth wavelength band is, for example, light in a yellow wavelength band (also referred to as yellow light).

In the first pixel Px1, the second color filter layer 62 located in the second contact hole 77 determines the wavelength band of the transmitted light depending on whether a layer for transmitting another light is provided around the second contact hole 77. The expression "around the second contact hole" means a vertical direction of the second contact hole 77 when viewed in a plan view. The expression "vertical direction" is a column direction of a pixel arrangement when viewed in a plan view (see FIG. 3). In other words, the expression "around the second contact hole" corresponds to a transverse direction of the second contact hole 77 when viewed in a cross-sectional view (see FIGS. 4 to 6). The expression "another light" means light other than the light in the first wavelength band, and in the present embodiment, is light other than the red light.

For example, when the arrangement of colors is a general stripe arrangement (for example, see FIG. 3), in the first pixel Px1, only the first color filter layer 61 for transmitting the light in the first wavelength band is present around the second contact hole as a layer for transmitting the light (also referred to as a transmission portion). This corresponds to an aspect (referred to as Aspect (i)) in which a layer for transmitting another light is not provided around the second contact hole 77. In Aspect (i), the second color filter layer 62 is assumed to transmit the light in the same wavelength band as the first color filter layer 61 (red light in the present embodiment). In the present embodiment, the arrangement of colors is a stripe arrangement (see FIG. 3), and the present embodiment corresponds to Aspect (i).

Further, for example, when the arrangement of colors is an SPR arrangement such as PenTile arrangement, in the first pixel Px1, a layer for transmitting another light (light other than the red light in the present embodiment) (transmission portion) is present around the second contact hole 77. This corresponds to an aspect (referred to as Aspect (ii)) in which a layer for transmitting another light is provided around the second contact hole 77. In Aspect (ii), the second color filter layer 62 is assumed to (II-1) transmit the light in the same wavelength band as the first color filter layer 61 of the first pixel Px1 (red light in the present embodiment) or (ii-2) transmit the light in the same wavelength band as the transmission portion (light other than the red light in the present embodiment). Aspect (ii) will be described below as Embodiment 4.

Figure 24:
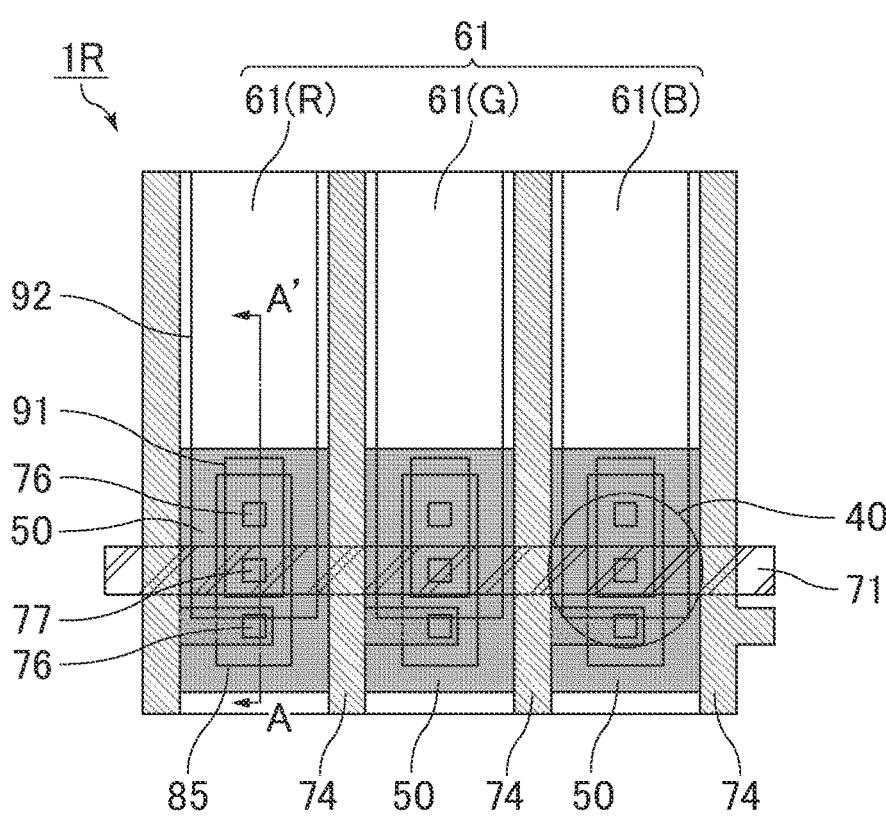
FIG. 24 is an enlarged schematic plan view illustrating a part of pixels of a liquid crystal panel including an active matrix substrate according to a comparative embodiment.
Figure 25:
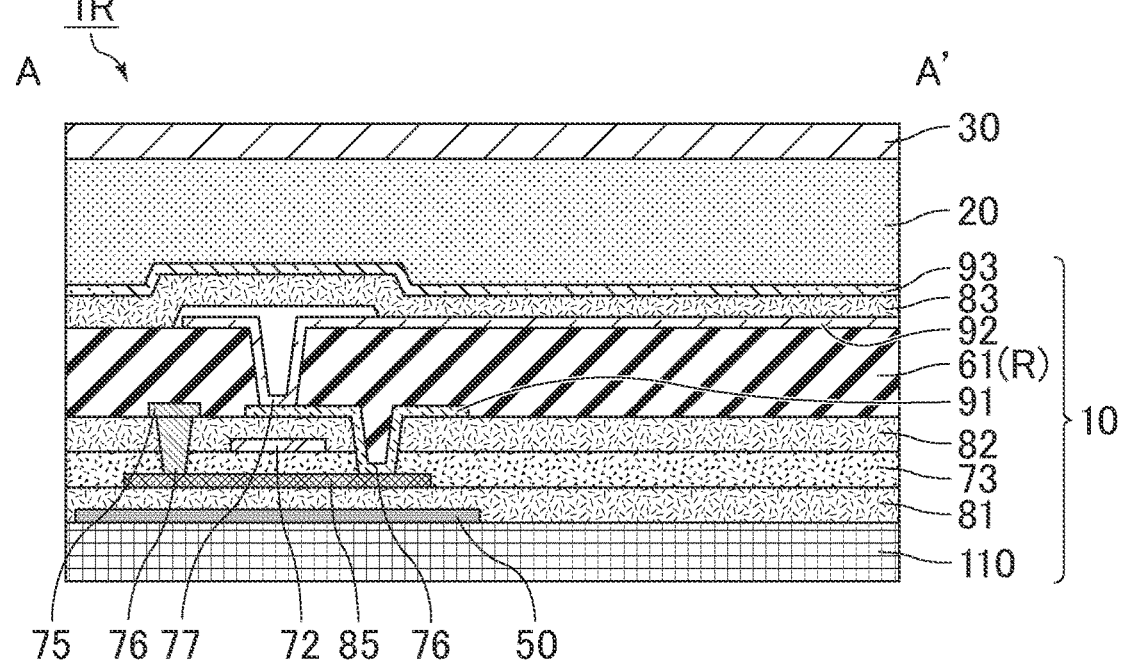
FIG. 25 is a cross-sectional view taken along line A-A' in FIG. 24 as a cut surface (cross-sectional view taken along line A-A')

In this case, in the pixel of the related art, the second color filter layer 62 is not provided in the second contact hole 77 (for example, see FIGS. 24 and 25). FIG. 24 is an enlarged schematic plan view illustrating a part of pixels of a liquid crystal panel including an active matrix substrate corresponding to the pixel in the related art, and FIG. 25 is a cross-sectional view taken along line A-A' in FIG. 24 as a cut surface (cross-sectional view taken along line A-A'). In an active matrix substrate 10R of a comparative embodiment, generally, the inside of the second contact hole 77 is empty or filled with a filler such as an organic film. When a light source is installed on a rear surface side of the active matrix substrate 10R, the light transmitted through the second contact hole 77 is incident on the counter substrate 30 as it is (for example, as white light when a white light source is used). Therefore, a tinge of the emitted light changes, for example, the light emitted from each pixel Px is mixed with white light, and an image cannot be displayed with the correct color. That is, the tinge of the display changes. Therefore, it is demanded to provide a light shielding layer 50 such that the light is not incident on the second contact hole 77 (see FIGS. 24 and 25). As a result, the second contact hole 77 cannot be used as a transmission portion, and thus the pixel aperture ratio is reduced.

On the other hand, in the first pixel Px1 of the present embodiment, the first color filter layer 61 and the second color filter layer 62 disposed in the second contact hole 77 transmit the light in the same wavelength band, and can act as a transmission portion. As a result, a step difference in the second contact hole 77 is flattened (that is, a step difference is suppressed), and the tinge of the light transmitted through the second contact hole 77 can be returned to normal. In addition, in the first pixel Px1, it is not demanded to shield the light in the second contact hole 77, and the region of the second contact hole 77 can also function as the color filter layer, and thus the pixel aperture ratio is increased. In addition, the step difference in the second contact hole 77 is suppressed to reduce the step difference in the surface in contact with the liquid crystal layer 20 of the active matrix substrate 10, disturbance of the alignment of the liquid crystal layer 20 is also sufficiently suppressed.

As described above, in the first pixel Px1, since it is not demanded to shield the light in the second contact hole 77, a width of the light shielding layer 50 overlapping the second contact hole 77 in the first pixel Px1 (which means a width when viewed in a plan view) can be reduced, and the light shielding layer 50 itself can be not demanded.

In the present embodiment, the second color filter layer 62 is not provided other than the second contact hole 77. In other words, the second color filter layer 62 is provided only in the second contact hole 77. However, since a part of the second color filter layer 62 cannot be completely prevented from swelling or protruding from the second contact hole 77 in manufacturing, the swollen form or protruding form is also involved in the "form having the second color filter layer 62 only in the second contact hole 77". On the other hand, for example, as illustrated in FIGS. 4 and 5 in Japanese Unexamined Patent Application Publication No. 2003-215639, a structure in which an overcoat layer formed of a color filter material and a color filter layer are laminated as a layer does not apparently correspond to the "form having the second color filter layer 62 only in the second contact hole 77".

The first pixel Px1 desirably does not have a columnar spacer having a long diameter of 3 μm or greater when viewed in a plan view. As a result, light leakage or alignment disturbance due to a general columnar spacer (also referred to as a photo spacer) is sufficiently suppressed. Among them, it is more desirable that the columnar spacer is not provided. In addition, it is desirable that the first pixel Px1 does not have a light shielding layer having a long diameter of 5 μm or greater when viewed in a plan view, at a position overlapping the second contact hole 77 when viewed in a plan view. As a result, the pixel aperture ratio is further increased. Among them, it is more desirable that the light shielding layer is not provided at the position overlapping the second contact hole 77 when viewed in a plan view. In the present embodiment, the first pixel Px1 (red pixel) does not have the columnar spacer 40 and the light shielding layer 50 (see FIGS. 3 and 4).

The minimum size of the photo spacer, which is common in the liquid crystal device field, is about 4 to 5 μm or greater when viewed in a plan view. Therefore, the width of the light shielding layer that shields the light in the photo spacer when viewed in a plan view is about 6 to 8 μm or greater is the minimum size when the alignment shift and the like are taken into consideration. The light shielding layer is also referred to as a light shielding film.

In this case, for example, when the size of one pixel (when viewed in a plan view) is 6 μm×18 μm by way of example, it can be seen that the pixel aperture ratio is increased by about 10% or greater in relative proportions when the light shielding layer 50 is not provided at the position overlapping the second contact hole 77 when viewed in a plan view (see FIG. 4), as compared to when the light shielding layer 50 is provided at the position overlapping the second contact hole 77 when viewed in a plan view (see FIG. 25). However, since the pixel aperture ratio also depends on, for example, a width of each line, a thickness of the color filter layer, a size of the contact hole, a width of the light shielding layer, and the like, the numerical value is merely a reference value. As described above, in the present embodiment, the pixel aperture ratio in the first pixel Px1 can be increased. In addition, in a case of a higher definition pixel, an area of one pixel is small, and a ratio of an area occupied by the light shielding layer to the one pixel is large, so that the great effect of increasing the pixel aperture ratio according to the present disclosure is obtained. Therefore, it is desirable that the liquid crystal panel 1 is a high-definition liquid crystal panel.

The second pixel Px2 is a pixel other than the first pixel Px1, and has the first color filter layer 61 for transmitting the light in the second wavelength band (green light in the present embodiment). In the second pixel Px2, the second color filter layer 62 disposed in the second contact hole 77 transmits the light in the same wavelength band as the second color filter layer 62 of the first pixel Px1. In the present embodiment, since the second color filter layer 62 of the first pixel Px1 (red pixel) transmits the red light, the second color filter layer 62 of the second pixel Px2 (green pixel) also transmits the red light.

In the second pixel Px2, the first color filter layer 61 and the second color filter layer 62 in the second contact hole 77 transmit light in mutually different wavelength bands.

Therefore, in order to suppress chromaticity shift and color mixture, the second pixel Px2 includes the light shielding layer 50 at a position overlapping the second contact hole 77 when viewed in a plan view (see FIG. 5). The light shielding layer 50 desirably has a long diameter of 5 μm or greater when viewed in a plan view.

The second pixel Px2 has the same structure as the first pixel Px1 except for the transmission wavelength band of the first color filter layer 61 thereof and the presence or absence of the light shielding layer 50.

The third pixel Px3 is a pixel other than the first pixel Px1 and the second pixel Px2, and has the first color filter layer 61 for transmitting the light in the third wavelength band (blue light in the present embodiment). In the third pixel Px3, the second color filter layer 62 disposed in the second contact hole 77 transmits the light in the same wavelength band as the second color filter layer 62 of the first pixel Px1. In the present embodiment, since the second color filter layer 62 of the first pixel Px1 (red pixel) transmits the red light, the second color filter layer 62 of the third pixel Px3 (blue pixel) also transmits the red light.

In the third pixel Px3, the first color filter layer 61 and the second color filter layer 62 in the second contact hole 77 transmit light in mutually different wavelength bands.

Therefore, in order to suppress chromaticity shift and color mixture, the third pixel Px3 includes the light shielding layer 50 at a position overlapping the second contact hole 77 when viewed in a plan view (see FIG. 6). The light shielding layer 50 desirably has a long diameter of 5 μm or greater when viewed in a plan view.

The third pixel Px3 also includes the columnar spacer 40 to easily control a thickness of the liquid crystal layer 20 (see FIG. 6). That is, the third pixel Px3 includes the columnar spacer 40 and the light shielding layer 50 with the second contact hole 77 interposed therebetween at the position overlapping the second contact hole 77 when viewed in a plan view (see FIG. 6). The columnar spacer 40 desirably has a long diameter of 3 μm or greater when viewed in a plan view.

The pixel in which the columnar spacer 40 is disposed is desirably a blue pixel. This is because, from an ergonomic perspective, blue has the worst viewability, and therefore, it is considered that the effect on viewability due to the reduction in aperture ratio is the least. In consideration of this point, in the present embodiment, the third pixel Px3 is a blue pixel. In addition, the columnar spacer 40 may be disposed in the second pixel Px2 (green pixel in the present embodiment) instead of the third pixel Px3 or together with the third pixel Px3.

The third pixel Px3 has the same structure as the first pixel Px1 except for the transmission wavelength band of the first color filter layer 61 thereof and the presence or absence of the light shielding layer 50 and the columnar spacer 40.

As described above, in the present embodiment, the first pixel Px1 does not have the light shielding layer 50 at the position overlapping the second contact hole 77 when viewed in a plan view, whereas each of the second pixel Px2 and the third pixel Px3 has the light shielding layers 50 at the position overlapping the second contact hole 77 when viewed in a plan view (see FIGS. 3 to 6). That is, in the present embodiment, the light shielding layer 50 in a lateral direction (that is, in the row direction) is divided when viewed in a plan view, and the light shielding layer 50 is disposed in an island shape (see FIG. 3). On the other hand, in the pixel of the related art, the light shielding layer 50 has a shape linearly connected in the lateral direction (row direction) (for example, see FIG. 24). In this case, for example, a large capacitance is provided between the light shielding layer 50 and the gate line 71, and there is a concern that defective electrostatic discharge may occur. However, in the present embodiment, since the light shielding layer 50 can be divided into island shapes, the capacitance between the light shielding layer 50 and the gate line 71 can be reduced, so that the possibility of occurrence of defective electrostatic discharge can be sufficiently reduced.

In the present embodiment, since one type of the second color filter layer 62 formed in the second contact hole 77 can be used in the plurality of pixels Px, the number of steps when forming the second color filter layer 62 can be reduced. Therefore, the manufacturing efficiency can be further improved and the manufacturing cost can be reduced.

The active matrix substrate 10 of the present embodiment (and the liquid crystal panel 1 and a liquid crystal display device 100 including the same) desirably performs display by applying a voltage between the pixel electrode 92 and the common electrode 93, and applying a horizontal electric field (including a fringe electric field) or a vertical electric field to the liquid crystal layer. Examples of the horizontal electric field type include a fringe field switching (FFS) mode and an in plane switching (IPS) mode in which liquid crystal molecules in the liquid crystal layer are aligned in parallel to a substrate surface when no voltage is applied. Examples of the vertical electric field type include vertical alignment (VA) in which liquid crystal molecules in the liquid crystal layer are aligned perpendicular to a substrate surface when no voltage is applied.

The liquid crystal panel 1 is manufactured, using the active matrix substrate 10 of the present embodiment, by bonding, for example, the active matrix substrate 10 manufactured by the following method (1) and, for example, the counter substrate 30 manufactured by the following method (2) to each other using a sealing material and the like, and injecting a liquid crystalline composition into a gap between the active matrix substrate 10 and the counter substrate 30 to form the liquid crystal layer 20, and then dividing the obtained structure body.

(1) Method for Manufacturing Active Matrix Substrate 10

When an example of a method for manufacturing the active matrix substrate 10 of the present embodiment is described, the manufacturing method desirably includes: a step of forming the TFT (1-1); a step of forming the first color filter layer 61 having the second contact hole 77 (1-2), a step of forming the pixel electrode 92 (1-3), and a step of forming the second color filter layer 62 (1-4). Furthermore, it is more desirable to include a step of forming the common electrode 93 (1-5). The support substrate 110 has a plurality of pixel regions, and the active matrix substrate 10 including the plurality of pixels Px located in the plurality of pixel regions, respectively, is manufactured by performing the following steps in each of the pixel regions. Hereinafter, each step will be described in detail with reference to FIGS. 4 to 6 and the like.

(1-1) Step of Forming TFT

First, a conductive film is formed on the support substrate 110, and the conductive film is processed into a desired shape in a photolithography step. The conductive film is not provided on a portion where the second contact hole 77 is provided in a region serving as the first pixel Px1 when viewed in a plan view. The conductive film serves as the light shielding layer 50.

The support substrate 110 is an insulating substrate (also referred to as an insulating substrate), but a transparent substrate is desirable, and examples thereof include a glass substrate and a plastic substrate. In addition, the material of the conductive film is not particularly limited, but examples thereof may include a metal material that is used as a material of a black matrix (also referred to as BM). Specific examples of the metal material include tungsten (W) and the like. A thickness of the obtained light shielding layer 50 is not particularly limited, and for example, it is preferable that a lower limit thereof is 10 nm or greater and an upper limit thereof is 1000 nm or less. It is more preferable that the lower limit is 30 nm or greater, and the upper limit is 500 nm or less.

Next, an insulating film (first insulating film 81) is formed. The insulating film (first, second, and third insulating films 81, 82, and 83 or the gate insulating film 73) is desirably, for example, an inorganic insulating film. Examples of the inorganic insulating film may include an inorganic film (dielectric constant ε=5 to 7) such as silicon nitride (SiNx) or silicon oxide (SiO2), or a laminated film thereof. A thickness of each insulating film is not particularly limited, and for example, it is preferable that a lower limit thereof is 10 nm or greater and an upper limit thereof is 1000 nm or less. It is more preferable that the lower limit is 30 nm or greater, and the upper limit is 500 nm or less.

Next, the semiconductor film 85 of the TFT is formed on the first insulating film 81, and the semiconductor film is processed into a desired shape through the photolithography step. The semiconductor film 85 is desirably, for example, an In—Ga—Zn—O-based oxide semiconductor (IGZO). In addition, the semiconductor film 85 may be composed of a high-resistance semiconductor layer formed of amorphous silicon, polysilicon, or the like, and a low-resistance semiconductor layer formed of n+ amorphous silicon or the like obtained by doping amorphous silicon with impurities such as phosphorus. A thickness of the semiconductor film 85 is not particularly limited, and for example, it is preferable that a lower limit thereof is 10 nm or greater and an upper limit thereof is 1000 nm or less. It is more preferable that the lower limit is 30 nm or greater, and the upper limit is 500 nm or less.

Next, after the gate insulating film 73 is formed, a conductive film is formed on the gate insulating film 73, and the conductive film is processed into a desired shape through the photolithography step. The conductive film serves as the gate line 71 and the gate electrode 72. Examples of the material of the gate line 71 and the gate electrode 72 include metals such as copper, titanium, aluminum, molybdenum, and tungsten, or alloys thereof, and may be a single layer or a laminated structure of a plurality of layers.

Next, an insulating film (second insulating film 82) is formed, and an opening portion is formed in a region serving as a later contact hole (first contact hole 76) by the photolithography step. That is, the insulating film formed in the region is removed. Specifically, a part of the second insulating film 82 is etched. As a result, the first contact hole 76 in which the semiconductor film 85 is exposed on the bottom surface can be formed in the second insulating film 82.

Next, a conductive film is formed on the second insulating film 82, and the conductive film is processed into a desired shape through the photolithography step. As the conductive film serves as the source line 74 and the source electrode 75. Examples of the material of the source line 74 and the source electrode 75 include metals such as copper, titanium, aluminum, molybdenum, and tungsten, or alloys thereof, and may be a single layer or a laminated structure of a plurality of layers.

Next, a transparent electrode (first transparent electrode 91) is formed and patterned by the photolithography step. The transparent electrodes (first, second, and third transparent electrodes 91, 92, and 93) may be formed of, for example, transparent conductive materials such as indium tin oxide (ITO), indium zinc oxide (IZO), zinc oxide (ZnO), and tin oxide (SnO), or an alloy thereof. A thickness of each transparent electrode is not particularly limited, and for example, it is preferable that a lower limit thereof is 10 nm or greater and an upper limit thereof is 1000 nm or less. It is more preferable that the lower limit is 30 nm or greater, and the upper limit is 500 nm or less.

Accordingly, a TFT is manufactured on the support substrate 110.

(1-2) Step of Forming First Color Filter Layer 61 Having Second Contact Hole 77

Next, the first color filter layer 61 is formed on the second insulating film 82 to cover the TFT and the first transparent electrode 91. Specifically, after the first color filter layer 61 is formed using a color filter material (also referred to as a CF material), an opening portion is formed in a region serving as a later contact hole (second contact hole 77) by the photolithography step. That is, the first color filter layer 61 is removed from the region. Such a step is performed using the CF material of each color to form the first color filter layer 61 of each color in a region corresponding to each pixel.

Examples of the CF material of the first color filter layer 61 may include a colored photosensitive resin material. A thickness of the first color filter layer 61 is not particularly limited, and for example, it is preferable that a lower limit thereof is 10 nm or greater and an upper limit thereof is 10000 nm (that is, 10 μm) or less. It is more preferable that the lower limit is 30 nm or greater, and the upper limit is 2000 nm or less.

For example, in the present embodiment, a red photosensitive resin is used for the first pixel Px1, a green photosensitive resin is used for the second pixel Px2, and a blue photosensitive resin is used for the third pixel Px3, and the step (1-2) is repeated, so that (R), (G), and (B) of the first color filter layer 61 are formed in pixel regions of the first pixel Px1, the second pixel Px2, and the third pixel Px3, respectively.

(1-3) Step of Forming Pixel Electrode 92

Next, a transparent electrode (second transparent electrode 92) is formed, and the transparent electrode 92 is patterned by the photolithography step. That is, the second transparent electrode 92 is formed on the side surface and the bottom surface of the second contact hole 77 and on the first color filter layer 61. The transparent electrode serves as a pixel electrode.

(1-4) Step of Forming Second Color Filter Layer 62

Next, the second color filter layer 62 is formed in the second contact hole 77. Specifically, after the second color filter layer 62 is formed to cover the second contact hole 77 and the pixel electrode 92 by using the CF material for forming the second color filter layer 62, development is performed by the photolithography step such that the second color filter layer 62 remains only in the second contact hole 77. In this case, the exposure is desirably performed using a mask pattern that has a smaller size when viewed in a plan view than a mask pattern used when the second contact hole 77 is formed. As a result, the second color filter layer 62, which remains by the development, is spread outside the second contact hole 77, and the second color filter layer 62 is sufficiently suppressed from protruding from the second contact hole 77 and the second color filter layer 62 is sufficiently suppressed from swelling on the second contact hole 77.

Examples of the CF material for forming the second color filter layer 62 may include a colored photosensitive resin material. The CF material for forming the second color filter layer 62 is common for the first pixel Px1, the second pixel Px2, and the third pixel Px3. For example, when the second color filter layer 62 of the first pixel Px1 transmits the light in the same wavelength band as the first color filter layer 61 of the first pixel Px1, and when the red photosensitive resin is used for forming the first color filter layer 61 of the first pixel Px1, the red photosensitive resin is also used for forming the second color filter layer 62 of each of the second and third pixels Px2 and Px3.

After forming the second color filter layer 62, an etching-back step may be included as demanded. For example, when the second color filter layer 62 forms a step difference by swelling in the second contact hole 77, the step difference is reduced by performing the etching-back step, and thus smoothness on the surface of the active matrix substrate 10 is enhanced. Specifically, for example, after the second color filter layer 62 is formed in the second contact hole 77, at least a part of the second color filter layer 62 in the second contact hole 77 is removed by dry etching. For example, a part of the second color filter layer 62 is removed by dry etching using gas containing O2. Since the pixel electrode 92 is not substantially removed under the dry etching conditions, the first color filter layer 61 covered with the pixel electrode 92 is not substantially affected.

In the liquid crystal display device disclosed in Japanese Unexamined Patent Application Publication No. 2022-084146, metal wiring and a filling member are disposed inside the contact hole as described above. Therefore, a step of disposing the metal wiring is demanded during manufacturing. However, the manufacturing method of the present embodiment can omit the step of disposing the metal wiring in the contact hole, and is thus useful in terms of manufacturing efficiency and manufacturing cost.

(1-5) Step of Forming Common Electrode 93

Next, after the insulating film (third insulating film 83) is formed, the transparent electrode (third transparent electrode 93) is formed and patterned by the photolithography step. The transparent electrode serves as a common electrode.

Finally, the active matrix substrate 10 is obtained by forming an alignment film (not illustrated) as demanded. An alignment treatment (for example, optical alignment treatment) is performed on the alignment film.

(2) Method for Manufacturing Counter Substrate 30

First, the light shielding layer 50 is formed on a support substrate, and the light shielding layer 50 is patterned into a desired shape through the photolithography step, thereby forming a black matrix (BM). The light shielding layer 50 may be formed on the active matrix substrate 10 instead of being formed on the counter substrate 30. For example, the BM may be formed on the common electrode 93. Details of the support substrate are the same as those described above for the support substrate 110.

Examples of the material of the light shielding layer 50 may include a black photosensitive resin material, a metal material, or the like. For example, when the resin material is used, a thickness of the obtained light shielding layer 50 is not particularly limited, and for example, it is preferable that a lower limit thereof is 10 nm or greater and an upper limit thereof is 10 μm or less. It is more preferable that the lower limit is 100 nm or greater, and the upper limit is 3 μm or less.

Thereafter, the columnar spacer 40 is formed at a desired position. In the present embodiment, the columnar spacer 40 is formed at the position overlapping the second contact hole 77 of the third pixel Px3 (see FIGS. 3 and 6). The columnar spacer 40 is formed of, for example, a resin material having a light-transmitting property.

Finally, the counter substrate 30 is obtained by forming an alignment film (not illustrated) as demanded. An alignment treatment (for example, optical alignment treatment) is performed on the alignment film.

Next, the liquid crystal display device 100 including the active matrix substrate 10 of the present embodiment will be described by way of example.

Figure 7:
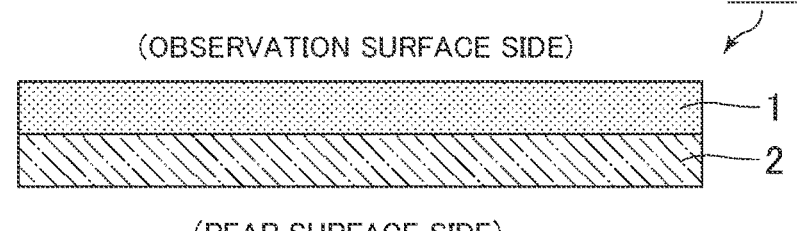
FIG. 7 is a schematic cross-sectional view of a desired example of the liquid crystal display device according to Embodiment 1.

FIG. 2 is also a schematic cross-sectional view of the liquid crystal display device 100 according to the present embodiment. As illustrated in FIG. 2, the liquid crystal display device 100 of the present embodiment includes the active matrix substrate 10, the liquid crystal layer 20, and the counter substrate 30 in order. Further, it is desirable that a backlight 2 is provided. When the backlight 2 is further provided, the liquid crystal display device 100 of the present embodiment includes the backlight 2 and the liquid crystal panel 1 in order from the rear surface side to the observation surface side, and the liquid crystal panel 1 includes the active matrix substrate 10, the liquid crystal layer 20, and the counter substrate 30 in order from the rear surface side to the observation surface side (see FIGS. 7 and 2). FIG. 7 is a schematic cross-sectional view of a desired example of the liquid crystal display device 100 according to the present embodiment.

The backlight 2 is not particularly limited as long as it emits light, and a direct-type backlight, an edge-type backlight, or any other type backlight may be used. Specifically, for example, the backlight 2 desirably includes a light source unit including a light guide plate and a light source, a reflective sheet, and a diffuser sheet. For example, a light emitting diode (LED) can be used as the light source.

In addition to the members described above, the liquid crystal display device 100 includes a plurality of members such as a polarizing plate; external circuits such as a tape carrier package (TCP) and a printed circuit board (PCB); optical films such as a viewing angle extending film and a luminance improving film; and a bezel (frame), and some members may be incorporated into other members. The members are not particularly limited, and members commonly used in the field of liquid crystal display devices can be used, so that the description thereof will be omitted.

Figure 8:
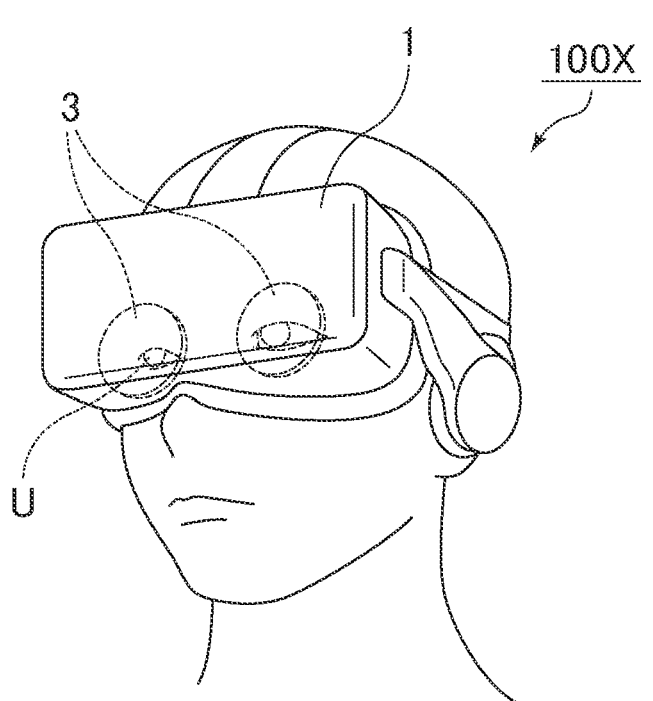
FIG. 8 is a schematic perspective view illustrating an example of an appearance of the liquid crystal display device according to Embodiment 1 when the liquid crystal display device is used as a head mounted display.

FIG. 8 is a schematic perspective view illustrating an example of an appearance of the liquid crystal display device 100 according to the present embodiment when the liquid crystal display device 100 is used as a head mounted display (also referred to as MID) 100X. As illustrated in FIG. 8, the head mounted display 100X is a display device that can be mounted on the head of a user, and includes the liquid crystal panel 1 for displaying an image, an optical element 3, and a backlight (not illustrated). The optical element 3 is, for example, a lens. A binocular HMD is illustrated in FIG. 8, and a monocular HMD may be used.

A display mode of the HMD is not particularly limited, and various display modes such as a horizontal alignment mode and a vertical alignment mode are desirably adopted. For example, as the HMD using the horizontal alignment mode, as described in Japanese Unexamined Patent Application Publication No. 2019-113584, it is desirable to adopt a technology having a feature in opening shape of an electrode used for forming a fringe electric field.

Embodiment 2

In the present embodiment, a feature unique to the present embodiment will be mainly described, and description of contents overlapping with those of Embodiment 1 will be omitted. The present embodiment is substantially the same as Embodiment 1, except that the light in the first wavelength band is green light and the light in the second wavelength band is red light. That is, in the present embodiment, the first pixel Px1 is a green pixel, the second pixel Px2 is a red pixel, and the third pixel Px3 is a blue pixel.

Figure 9:
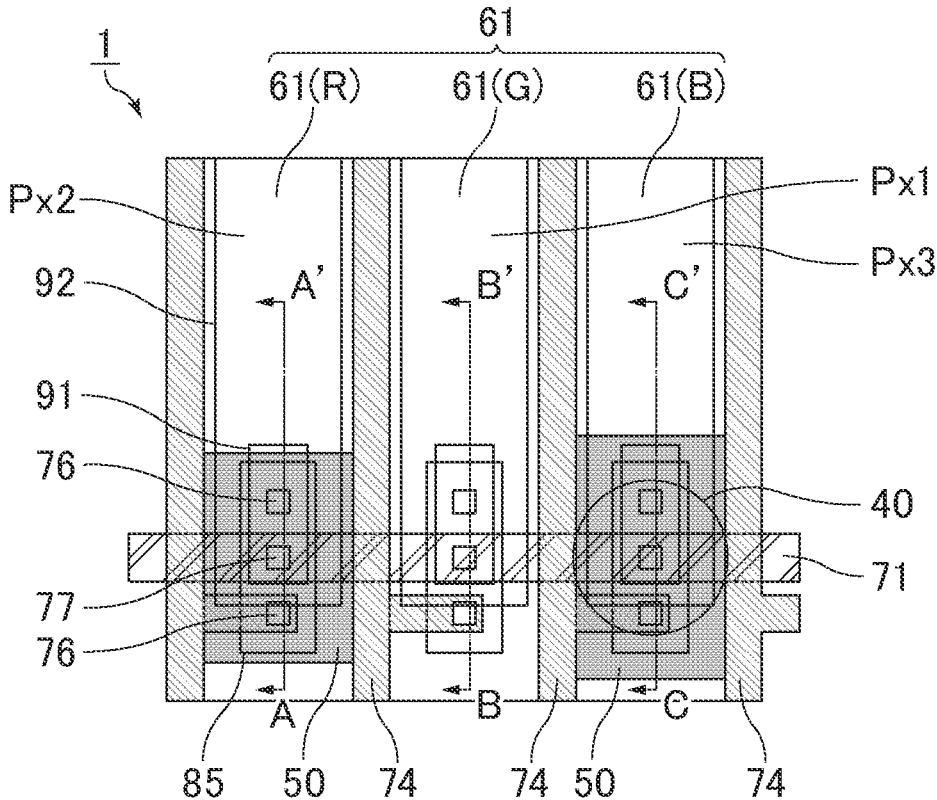
FIG. 9 is an enlarged schematic plan view illustrating a part of pixels of a liquid crystal panel including an active matrix substrate according to Embodiment 2.
Figure 10:
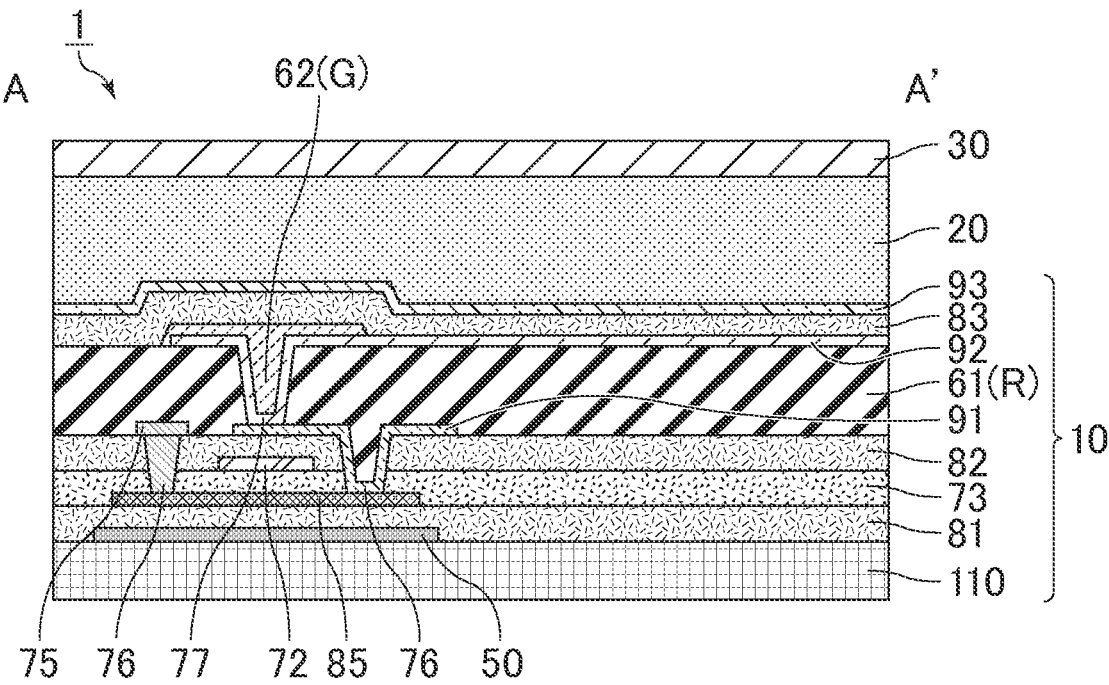
FIG. 10 is a cross-sectional view taken along line A-A' in FIG. 9 as a cut surface (cross-sectional view taken along line A-A')
Figure 11:
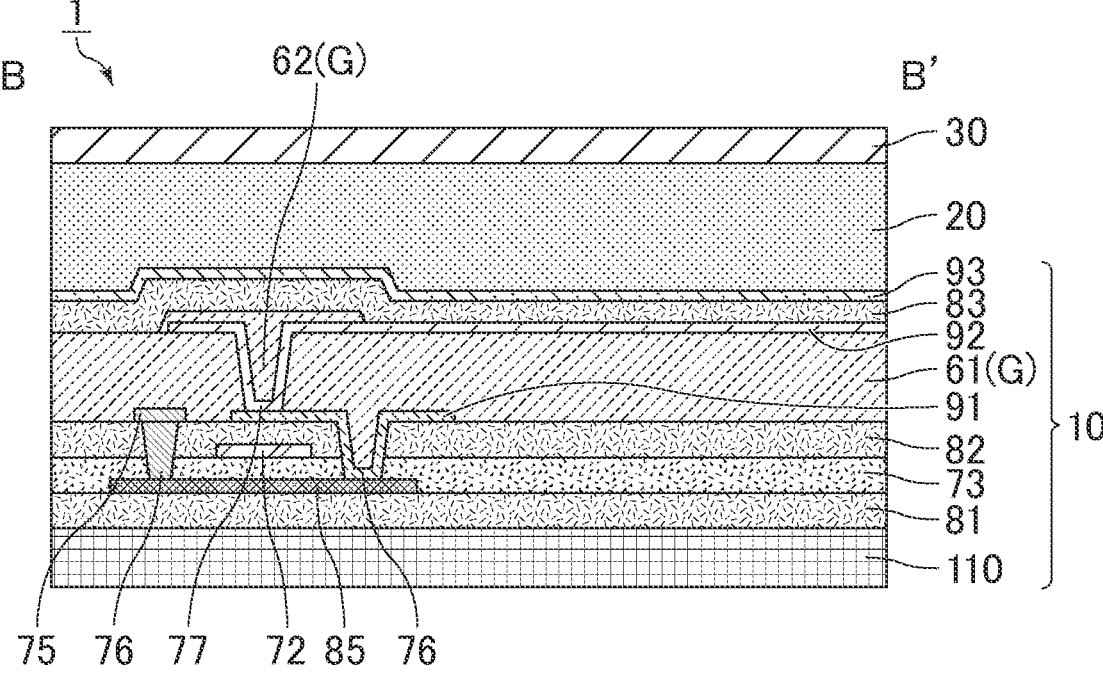
FIG. 11 is a cross-sectional view taken along line B-B' in FIG. 9 as a cut surface (cross-sectional view taken along line B-B')
Figure 12:
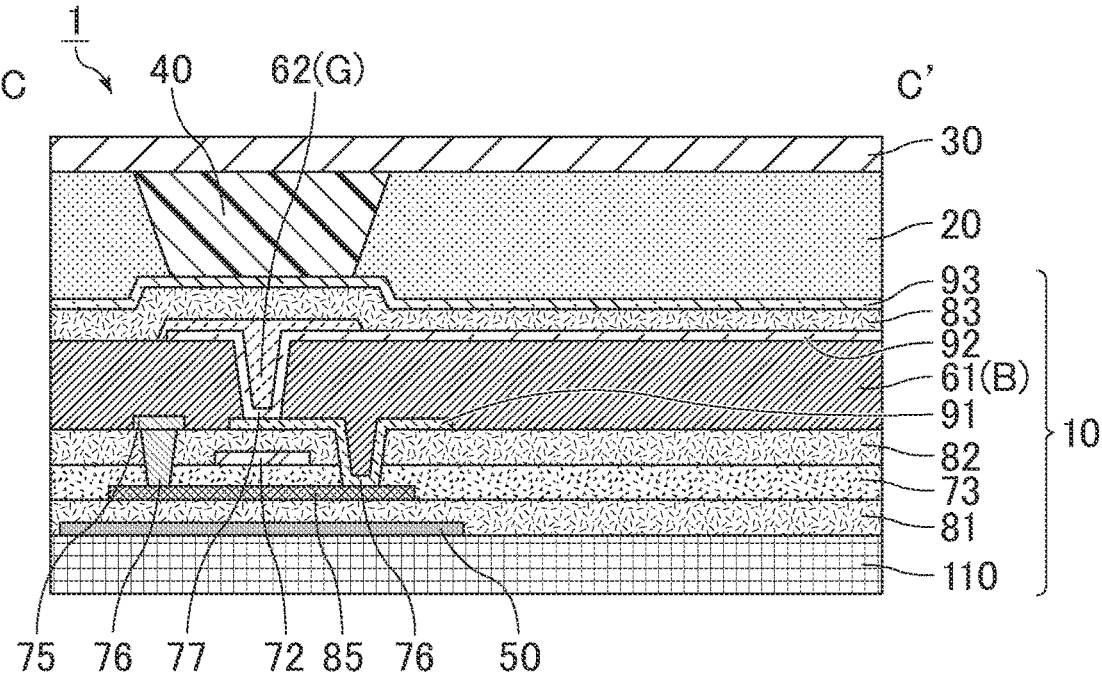
FIG. 12 is a cross-sectional view taken along line C-C' in FIG. 9 as a cut surface (cross-sectional view taken along line C-C')

FIG. 9 is an enlarged schematic plan view illustrating a part of pixels of the liquid crystal panel 1 including the active matrix substrate 10 according to an example of the present embodiment. The part of pixels of the liquid crystal panel 1 is simplified in FIG. 9. FIG. 10 is a cross-sectional view taken along line A-A' in FIG. 9 as a cut surface (cross-sectional view taken along line A-A'), and corresponds to a cross-sectional view of the second pixel Px2 (red pixel in the present embodiment). FIG. 11 is a cross-sectional view taken along line B-B' in FIG. 9 as a cut surface (cross-sectional view taken along line B-B'), and corresponds to a cross-sectional view of a first pixel Px1 (green pixel in the present embodiment). FIG. 12 is a cross-sectional view taken along line C-C' in FIG. 9 as a cut surface (cross-sectional view taken along line C-C'), and corresponds to a cross-sectional view of the third pixel Px3 (blue pixel in the present embodiment).

In the first pixel Px1 (green pixel), the second color filter layer 62 transmits the light (green light) at the same wavelength band as the first color filter layer 61. In the first pixel Px1, since it is not demanded to shield the light in the second contact hole 77, a width of the light shielding layer overlapping the second contact hole 77 in the first pixel Px1 can be reduced, and the light shielding layer itself can be not demanded. Also in the present embodiment, the first pixel Px1 (green pixel) does not have the columnar spacer 40 and the light shielding layer 50 (see FIGS. 9 and 11).

In the second pixel Px2 (red pixel), the first color filter layer 61 transmits the light in the second wavelength band (red light in the present embodiment), but the second color filter layer 62 transmits the light (green light) at the same wavelength band as the second color filter layer 62 of the first pixel Px1. In order to suppress chromaticity shift and color mixture, the second pixel Px2 includes the light shielding layer 50 at a position overlapping the second contact hole 77 when viewed in a plan view (see FIG. 10).

In the third pixel Px3 (blue pixel), the first color filter layer 61 transmits the light in the third wavelength band (blue light in the present embodiment), but the second color filter layer 62 transmits the light (green light) at the same wavelength band as the second color filter layer 62 of the first pixel Px1. In order to suppress chromaticity shift and color mixture, the third pixel Px3 includes the light shielding layer 50 at a position overlapping the second contact hole 77 when viewed in a plan view (see FIG. 12). The third pixel Px3 also includes the columnar spacer 40 to easily control a thickness of the liquid crystal layer 20 (see FIGS. 9 and 12).

Embodiment 3

In the present embodiment, a feature unique to the present embodiment will be mainly described, and description of contents overlapping with those of Embodiment 1 will be omitted. The present embodiment is substantially the same as Embodiment 1, except that the light in the first wavelength band is blue light and the light in the third wavelength band is red light. That is, in the present embodiment, the first pixel Px1 is a blue pixel, the second pixel Px2 is a green pixel, and the third pixel Px3 is a red pixel.

Figure 13:
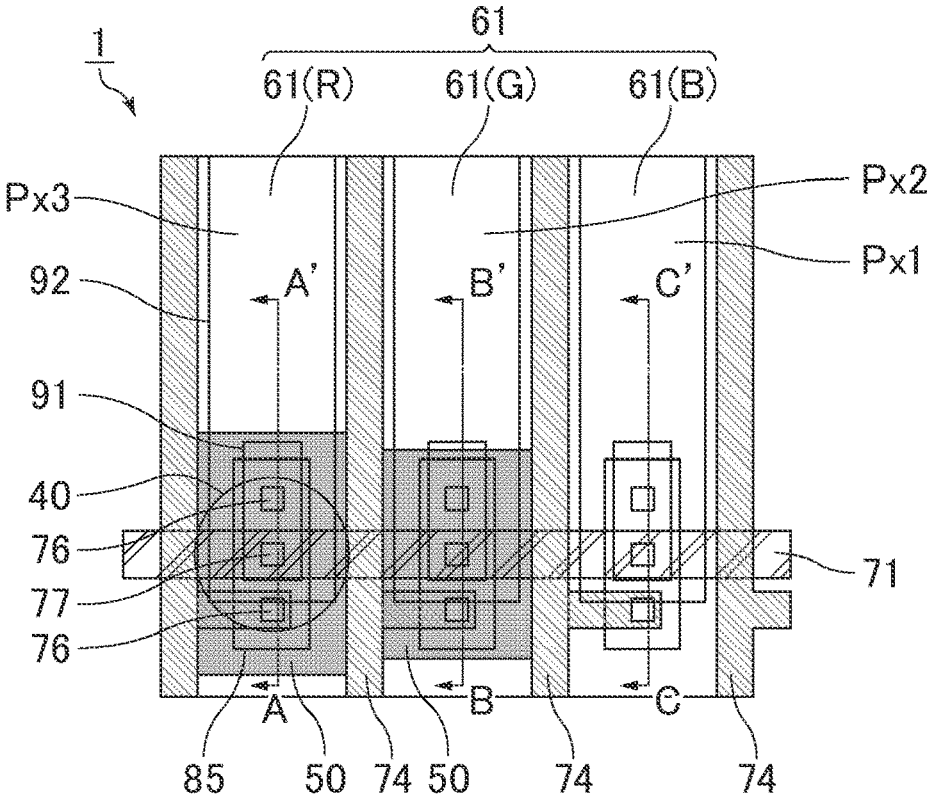
FIG. 13 is an enlarged schematic plan view illustrating a part of pixels of a liquid crystal panel including an active matrix substrate according to an example of Embodiment 3.
Figure 14:
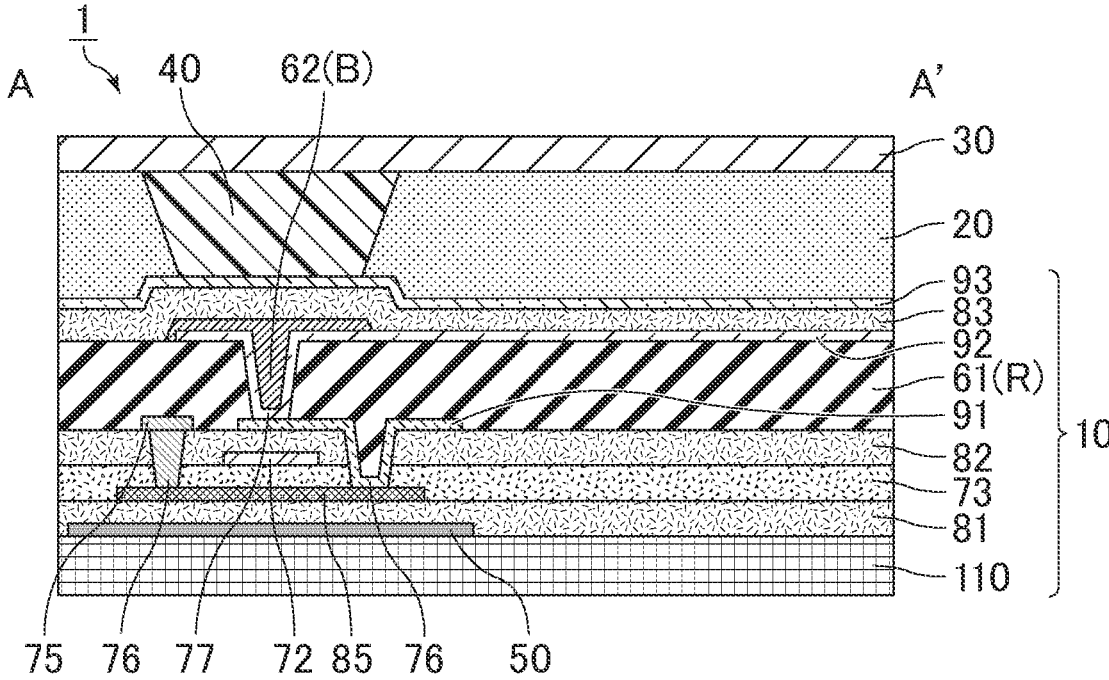
FIG. 14 is a cross-sectional view taken along line A-A' in FIG. 13 as a cut surface (cross-sectional view taken along line A-A')
Figure 15:
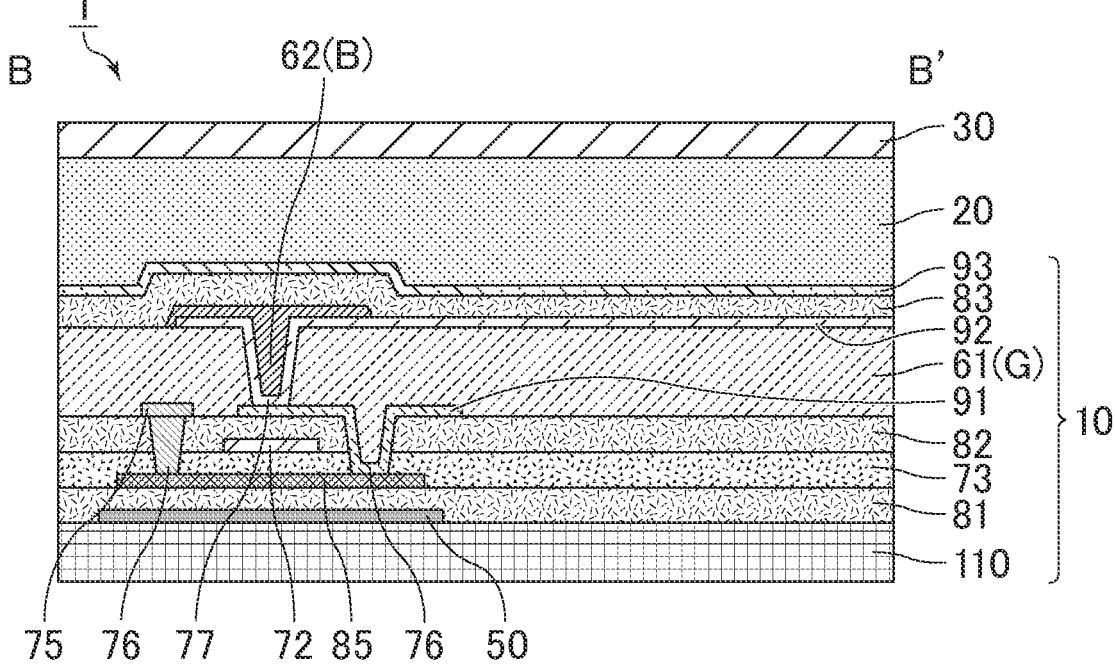
FIG. 15 is a cross-sectional view taken along line B-B' in FIG. 13 as a cut surface (cross-sectional view taken along line B-B')
Figure 16:
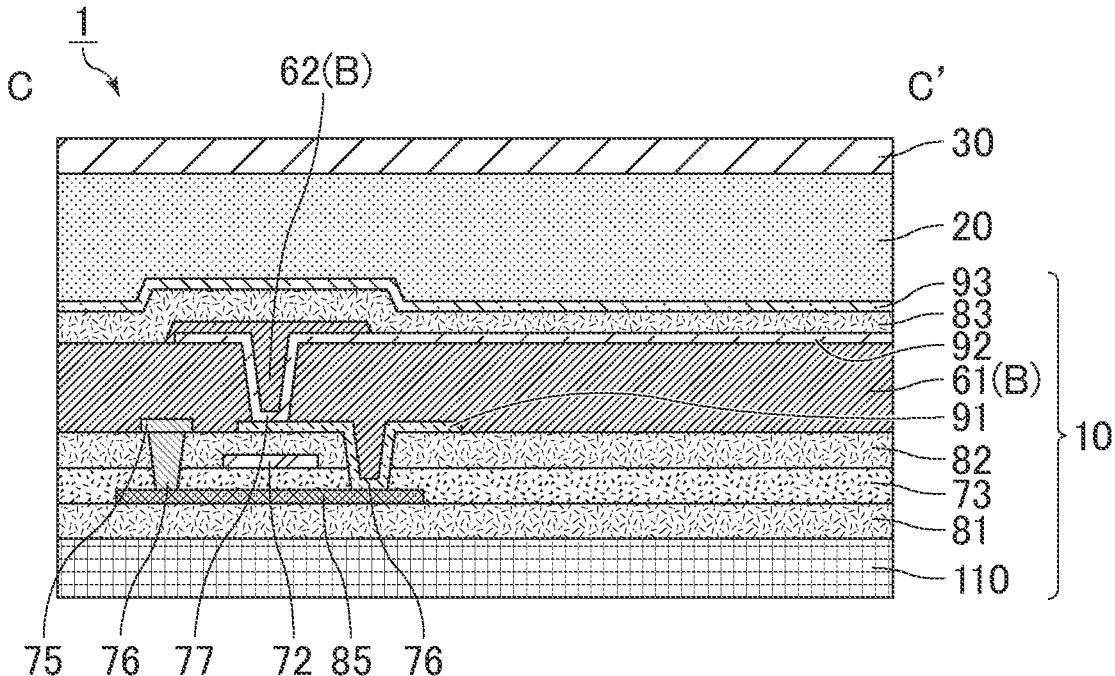
FIG. 16 is a cross-sectional view taken along line C-C' in FIG. 13 as a cut surface (cross-sectional view taken along line C-C')

FIG. 13 is an enlarged schematic plan view illustrating a part of pixels of the liquid crystal panel 1 including the active matrix substrate 10 according to an example of the present embodiment. The part of pixels of the liquid crystal panel 1 is simplified in FIG. 13. FIG. 14 is a cross-sectional view taken along line A-A' in FIG. 13 as a cut surface (cross-sectional view taken along line A-A'), and corresponds to a cross-sectional view of the third pixel Px3 (red pixel in the present embodiment). FIG. 15 is a cross-sectional view taken along line B-B' in FIG. 13 as a cut surface (cross-sectional view taken along line B-B'), and corresponds to a cross-sectional view of the second pixel Px2 (green pixel in the present embodiment). FIG. 16 is a cross-sectional view taken along line C-C' in FIG. 13 as a cut surface (cross-sectional view taken along line C-C'), and corresponds to a cross-sectional view of the first pixel Px1 (blue pixel in the present embodiment).

In the first pixel Px1 (blue pixel), the second color filter layer 62 transmits the light (blue light) at the same wavelength band as the first color filter layer 61. In the first pixel Px1, since it is not demanded to shield the light in the second contact hole 77, a width of the light shielding layer overlapping the second contact hole 77 in the first pixel Px1 can be reduced, and the light shielding layer itself can be not demanded. Also in the present embodiment, the first pixel Px1 (blue pixel) does not have the columnar spacer 40 and the light shielding layer 50 (see FIGS. 13 and 16).

In the second pixel Px2 (green pixel), the first color filter layer 61 transmits the light in the second wavelength band (green light in the present embodiment), but the second color filter layer 62 transmits the light (blue light) at the same wavelength band as the second color filter layer 62 of the first pixel Px1. In order to suppress chromaticity shift and color mixture, the second pixel Px2 includes the light shielding layer 50 at a position overlapping the second contact hole 77 when viewed in a plan view (see FIG. 15).

In the third pixel Px3 (red pixel), the first color filter layer 61 transmits the light in the third wavelength band (red light in the present embodiment), but the second color filter layer 62 transmits the light (blue light) at the same wavelength band as the second color filter layer 62 of the first pixel Px1. In order to suppress chromaticity shift and color mixture, the third pixel Px3 includes the light shielding layer 50 at a position overlapping the second contact hole 77 when viewed in a plan view (see FIG. 14). The third pixel Px3 also includes the columnar spacer 40 to easily control a thickness of the liquid crystal layer 20 (see FIGS. 13 and 14). The columnar spacer 40 may be disposed in the second pixel Px2 instead of the third pixel Px3 or together with the third pixel Px3.

Embodiment 4

In the present embodiment, a feature unique to the present embodiment will be mainly described, and description of contents overlapping with those of Embodiment 1 will be omitted. The present embodiment corresponds to an aspect (Aspect (ii)) including a layer for transmitting light other than the light in the first wavelength band around the second contact hole 77 of the first pixel Px1.

Figure 17:
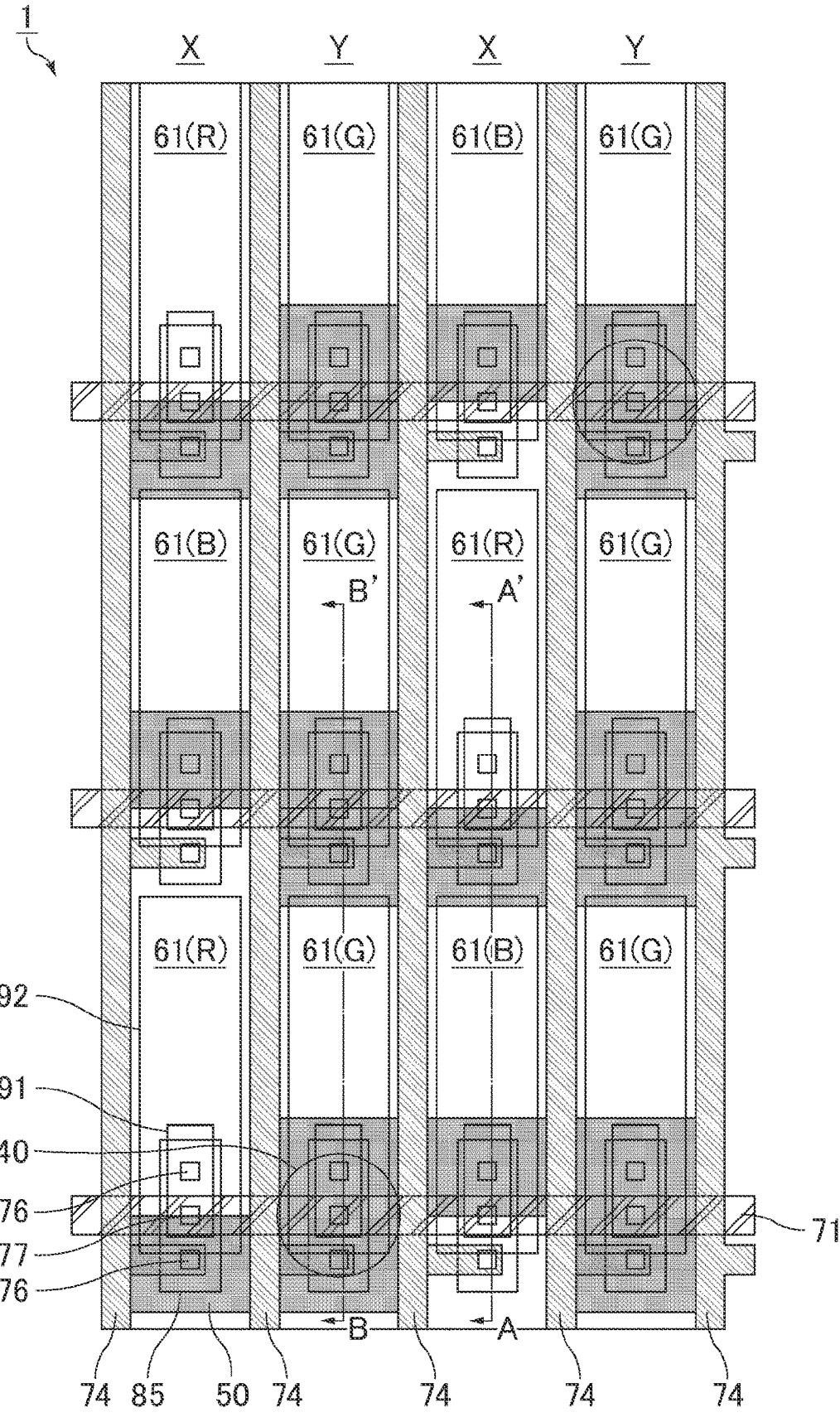
FIG. 17 is an enlarged schematic plan view illustrating a part of pixels of a liquid crystal panel including an active matrix substrate according to an example of Embodiment 4.
Figure 18:
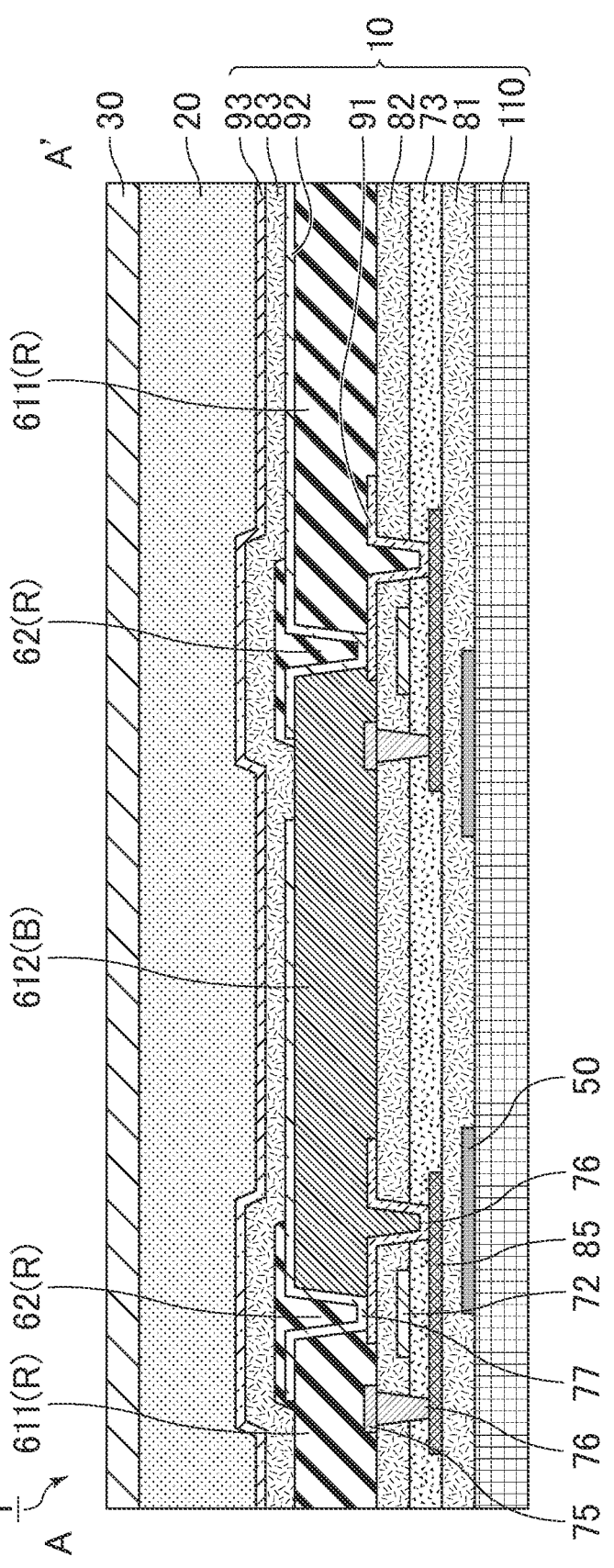
FIG. 18 is a cross-sectional view taken along line A-A' in FIG. 17 as a cut surface (cross-sectional view taken along line A-A')
Figure 19:
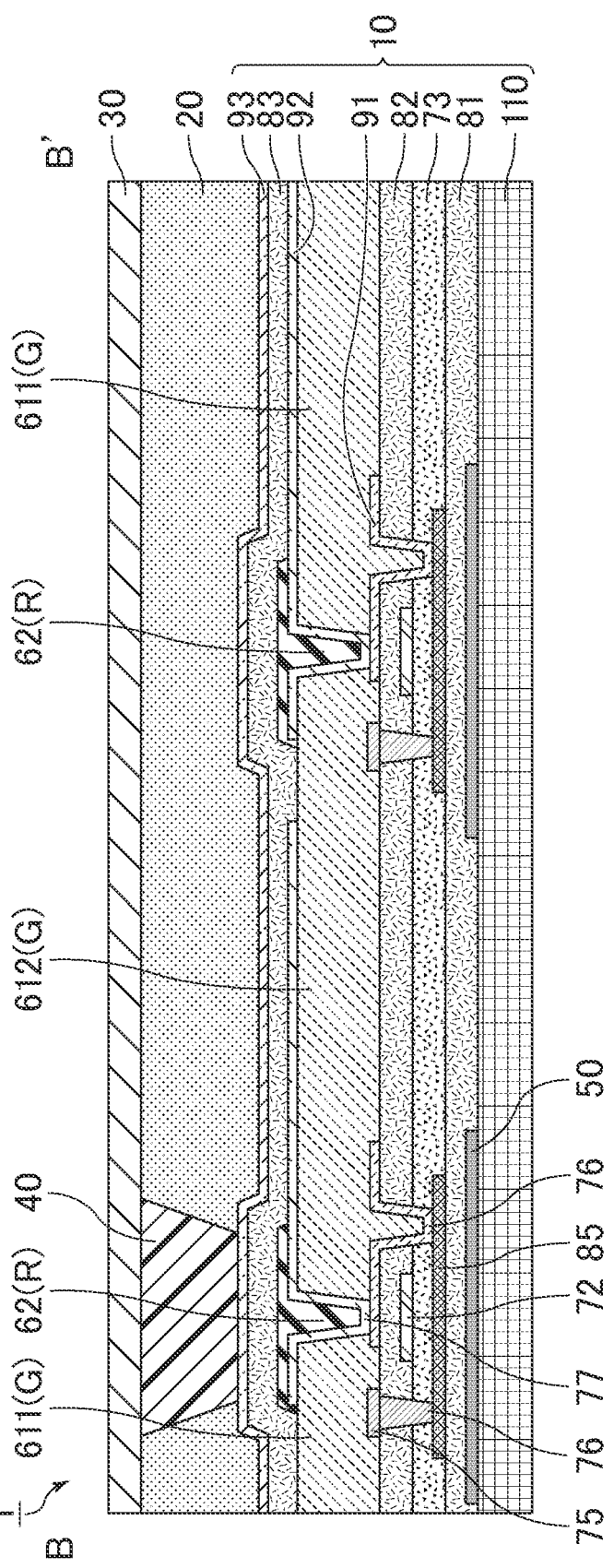
FIG. 19 is a cross-sectional view taken along line B-B' in FIG. 17 as a cut surface (cross-sectional view taken along line B-B')

FIG. 17 is an enlarged schematic plan view illustrating a part of pixels of the liquid crystal panel 1 including the active matrix substrate 10 according to an example of the present embodiment. The part of pixels of the liquid crystal panel 1 is simplified in FIG. 17. FIG. 18 is a cross-sectional view taken along line A-A' in FIG. 17 as a cut surface (cross-sectional view taken along line A-A'), and corresponds to a cross-sectional view of the first pixel Px1 and the second pixel Px2. FIG. 19 is a cross-sectional view taken along line B-B' in FIG. 17 as a cut surface (cross-sectional view taken along line B-B'), and corresponds to a cross-sectional view of the third pixel Px3.

The active matrix substrate 10 has a pixel array portion X in which the first pixel Px1 and the second pixel Px2 are alternately disposed in the column direction and a pixel array portion Y adjacent to the pixel array portion A in the row direction, when viewed in a plan view, and in the pixel array portion Y, only the third pixel Px3 is disposed in the column direction. That is, specifically, when viewed in a plan view, the color arrangement of a certain column is alternated with red, blue, red, and blue in the column direction, and in the column adjacent in the transverse direction (row direction), the stripe arrangement is only that of green, green, green, green, and green (see FIG. 17). As described above, in the present embodiment, the arrangement of colors is the PenTile arrangement, but the arrangement of colors in Aspect (ii) is not limited to the PenTile arrangement.

In the present embodiment, one of the light in the first wavelength band and the light in the second wavelength band is red light, the other is blue light, and the light in the third wavelength band is green light. That is, one of the first pixel Px1 and the second pixel Px2 is a red pixel, the other is a blue pixel, and the third pixel Px3 is a green pixel.

Since the first pixel Px1 and the second pixel Px2 are alternately disposed in the column direction in the pixel array portion X, it is difficult to distinguish whether the second contact hole 77 is disposed in a pixel region of either the first pixel Px1 or the second pixel Px2, when the second contact hole 77 is disposed over both the first pixel Px1 and the second pixel Px2. However, in the present disclosure, the second color filter layer 62 formed in the second contact hole 77 is common for the first pixel Px1, the second pixel Px2, and the third pixel Px3. That is, since the second color filter layer 62 is common for the plurality of pixels Px, there is no particular problem without distinguishing whether the second contact hole 77 is disposed in a pixel region of either the first pixel Px1 or the second pixel Px2.

When the pixel region of the first pixel Px1 is a region including a first color filter layer 611 (see FIG. 18), an adjacent first color filter layer 612 of the second pixel Px2 is present around the second contact hole 77 as a transmission portion in addition to the first color filter layer 611 (see FIG. 18). The first color filter layer 611 transmits the light in the first wavelength band, and the first color filter layer 612 transmits the light in the second wavelength band. In this case, the second color filter layer 62 disposed in the second contact hole 77 (ii-1) transmits the light in the same first wavelength band as the first color filter layer 611, or (ii-2) transmits the light in the second wavelength band that is the same as that of the first color filter layer 612. Among these, it is desirable to form the second color filter layer 62 using a material having higher transmittance of the CF material. For example, when the material is a red CF material and a blue CF material, the transmittance of the red CF material is generally higher, so that it is desirable that the second color filter layer 62 is formed of the red CF material, that is, the second color filter layer 62 transmits the red light.

Meanwhile, when the pixel region of the first pixel Px1 is a region including a first color filter layer 612 (see FIG. 18), it can be said that the adjacent first color filter layer 611 of the second pixel Px2 is present around the second contact hole 77 as a transmission portion in addition to the first color filter layer 612 (see FIG. 18). The first color filter layer 612 transmits the light in the first wavelength band, and the first color filter layer 611 transmits the light in the second wavelength band. In this case, the second color filter layer 62 disposed in the second contact hole 77 (ii-1) transmits the light in the same first wavelength band as the first color filter layer 612, or (ii-2) transmits the light in the second wavelength band that is the same as that of the first color filter layer 611.

In the pixel array portion X, either the second color filter layer 62, which is disposed in the second contact hole 77, or the first color filter layer 61, which is disposed around the second contact hole 77, (611 or 612 in FIG. 18) transmits the light in the same wavelength band (that is, the above (ii-1) or (ii-2)). In this case, it is not demanded to shield light of the second contact hole 77 in the pixel region including the first color filter layer 61 for transmitting the light in the same wavelength band as the second color filter layer 62. Therefore, a width of a portion of the light shielding layer 50 overlapping the second contact hole 77, which is disposed in the pixel region, can be reduced or removed.

When the first color filter layer 611 is a layer for transmitting the light in the same wavelength band as the second color filter layer 62 disposed in the second contact hole 77, as illustrated in FIG. 18, the width of the light shielding layer 50 can be reduced by the portion of the light shielding layer 50 overlapping the second contact hole 77, which is disposed in the pixel region including the first color filter layer 611. Therefore, in the pixel region including the first color filter layer 61 for transmitting the light in the same wavelength band as the second color filter layer 62, it is desirable that a light shielding layer having a long diameter of 5 μm or greater is not provided at the position overlapping the second contact hole 77 when viewed in a plan view. On the other hand, in the pixel region including the first color filter layer 61 (first color filter layer 612 in FIG. 18) for transmitting the light in the wavelength band different from that of the second color filter layer 62, the light shielding layer 50 is provided at the position overlapping the second contact hole 77 when viewed in a plan view (see FIG. 18).

Figure 26:
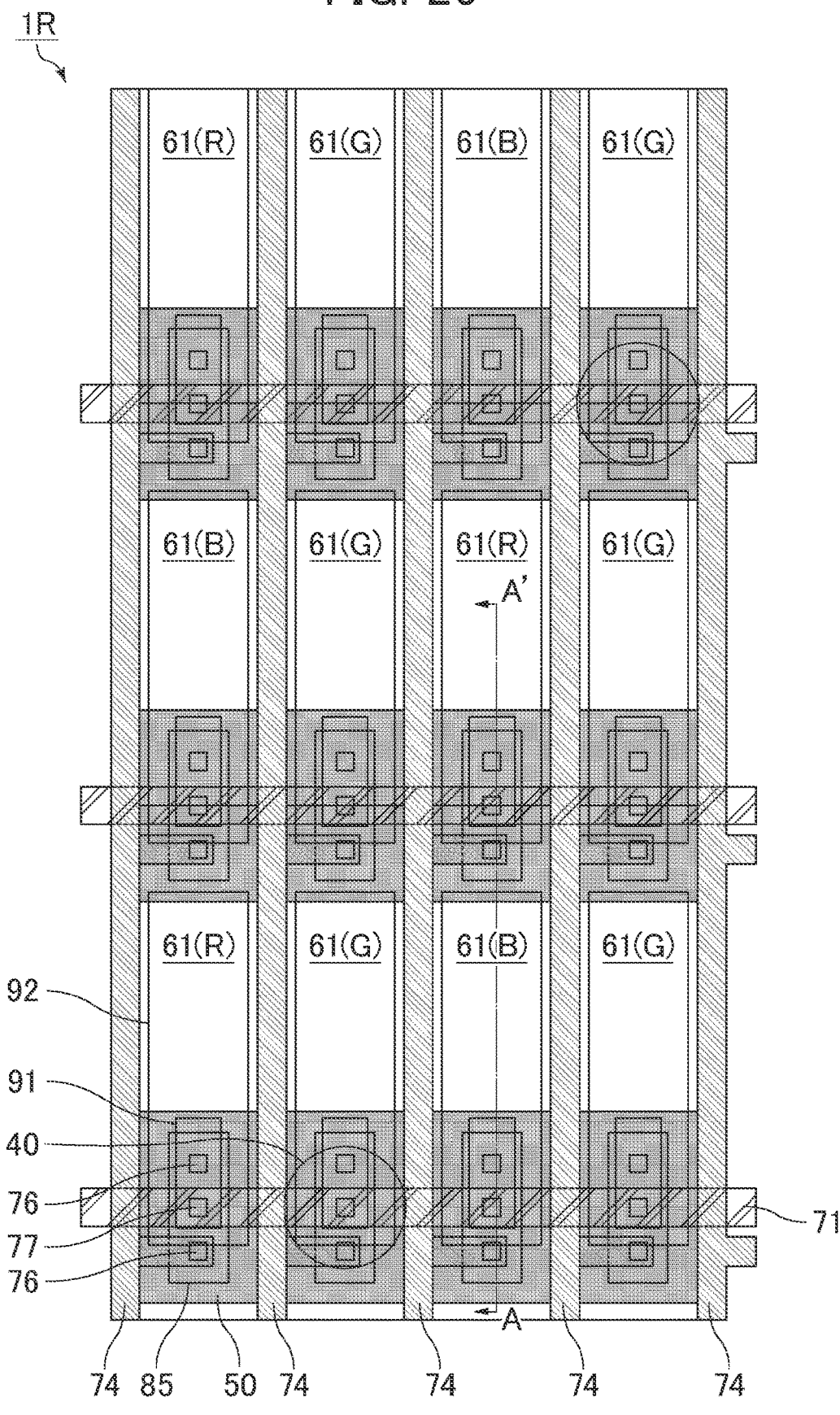
FIG. 26 is an enlarged schematic plan view illustrating a part of pixels of a liquid crystal panel including an active matrix substrate according to the comparative embodiment.
Figure 27:
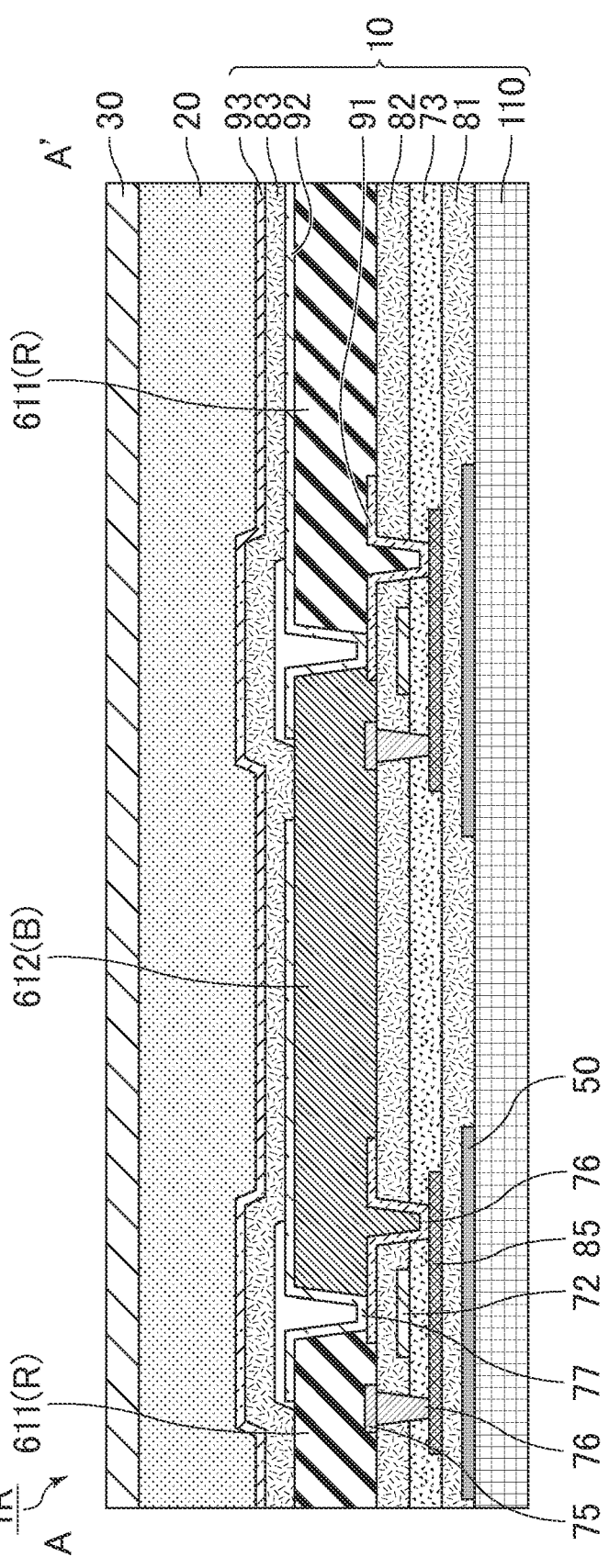
FIG. 27 is a cross-sectional view taken along line A-A' in FIG. 26 as a cut surface (cross-sectional view taken along line A-A')

In this case, in the pixel of the related art, the second color filter layer 62 is not provided in the second contact hole 77 (for example, see FIGS. 26 and 27). FIG. 26 is an enlarged schematic plan view illustrating a part of pixels of a liquid crystal panel including an active matrix substrate corresponding to the pixel in the related art, and FIG. 27 is a cross-sectional view taken along line A-A' in FIG. 26 as a cut surface (cross-sectional view taken along line A-A'). In an active matrix substrate 10R of the comparative embodiment, generally, the inside of the second contact hole 77 is empty or filled with a filler such as an organic film, so that it is demanded to sufficiently provide the light shielding layer 50 such that the light is not incident on the second contact hole 77 (see FIGS. 26 and 27). In this case, the second contact hole 77 cannot be completely used as the transmission portion, and thus the pixel aperture ratio is reduced.

The active matrix substrate 10R illustrated in FIGS. 26 and 27 is an example in which positions of the pixel arrangement and the columnar spacer 40 are disposed in the same positions as the present embodiment such that comparison is made easy with the present embodiment.

Further, it is desirable that the first pixel Px1 and the second pixel Px2 do not have a columnar spacer having a long diameter of 3 μm or greater when viewed in a plan view. Among them, it is more desirable that the columnar spacer is not provided. In the present embodiment, the first pixel Px1 and the second pixel Px2 do not have the columnar spacer 40 (see FIGS. 17 and 18).

In the third pixel Px3 (green pixel), the first color filter layers 611 and 612 transmit the light in the third wavelength band (green light in the present embodiment), but the second color filter layer 62 transmits the light in the same wavelength band as the second color filter layer 62 of the first pixel Px1 and the second pixel Px2 (that is, (ii-1) or (ii-2)). In order to suppress chromaticity shift and color mixture, the third pixel Px3 includes the light shielding layer 50 at a position overlapping the second contact hole 77 when viewed in a plan view (see FIGS. 17 and 19). The third pixel Px3 also includes the columnar spacer 40 to easily control a thickness of the liquid crystal layer 20 (see FIGS. 17 and 19).

Embodiment 5

In the present embodiment, a feature unique to the present embodiment will be mainly described, and description of contents overlapping with those of Embodiment 1 or Embodiment 4 will be omitted. The present embodiment is mainly different from Embodiment 4 in that it corresponds to an aspect (Aspect (i)) in which a layer for transmitting another light is not provided around the second contact hole 77 of the first pixel Px1.

Figure 20:
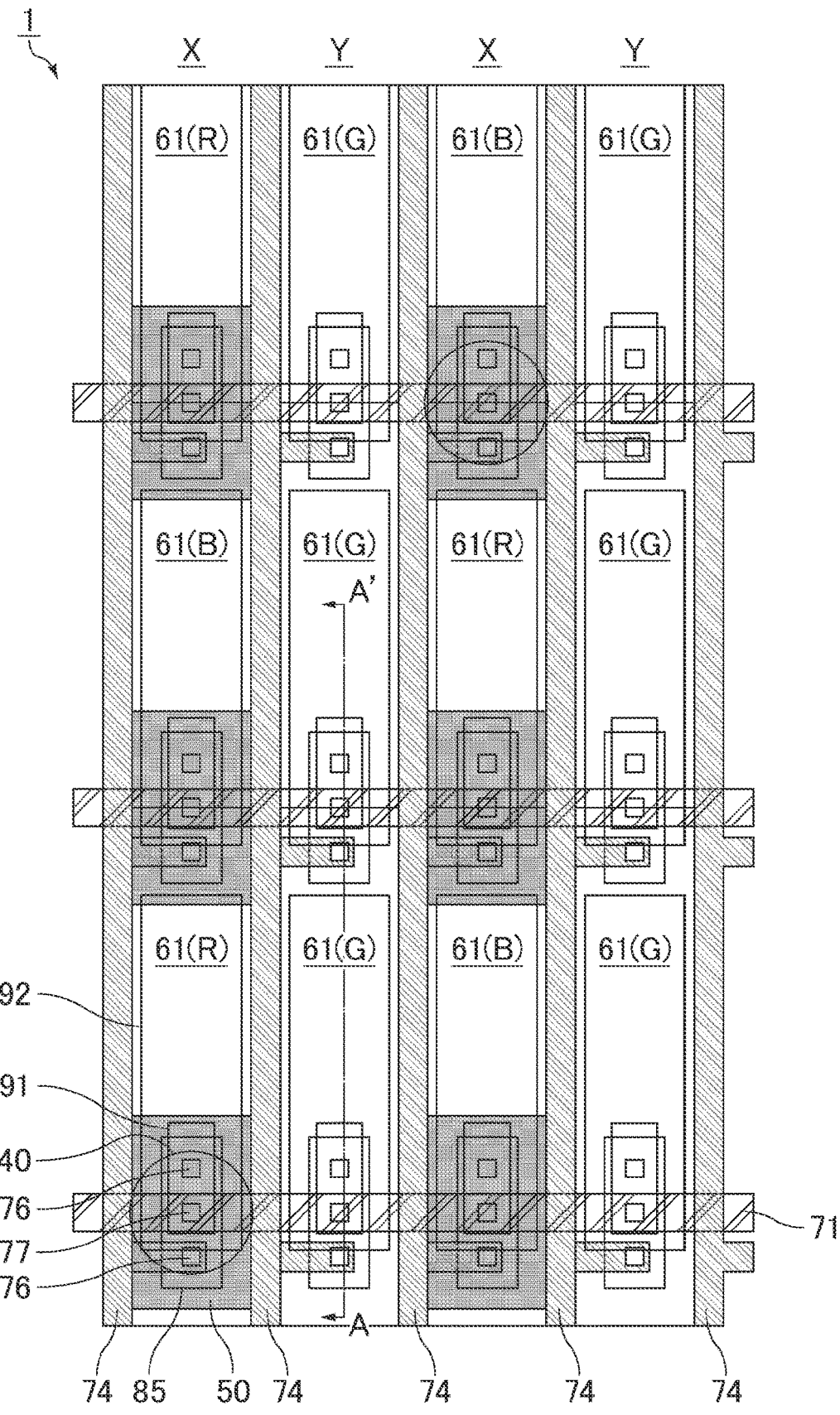
FIG. 20 is an enlarged schematic plan view illustrating a part of pixels of a liquid crystal panel including an active matrix substrate according to an example of Embodiment 5.
Figure 21:
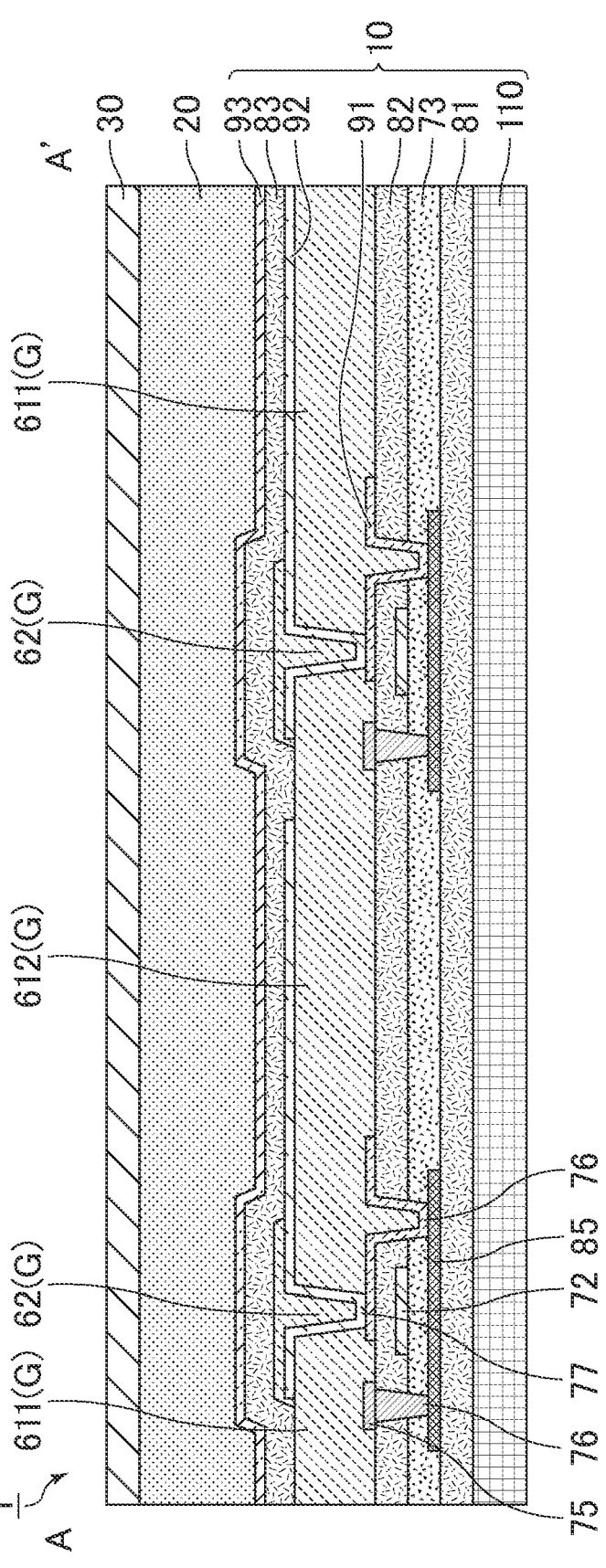
FIG. 21 is a cross-sectional view taken along line A-A' in FIG. 20 as a cut surface (cross-sectional view taken along line A-A')

FIG. 20 is an enlarged schematic plan view illustrating a part of pixels of the liquid crystal panel 1 including the active matrix substrate 10 according to an example of the present embodiment. The part of pixels of the liquid crystal panel 1 is simplified in FIG. 20. FIG. 21 is a cross-sectional view taken along line A-A' in FIG. 20 as a cut surface (cross-sectional view taken along line A-A'), and corresponds to a cross-sectional view of the first pixel Px1.

The active matrix substrate 10 has a pixel array portion Y in which only the first pixel Px1 is disposed in the column direction and a pixel array portion X adjacent to the pixel array portion Y in the row direction, when viewed in a plan view, and in the pixel array portion X, the second pixel Px2 and the third pixel Px3 are alternately disposed in the column direction. That is, specifically, like Embodiment 4, the color arrangement of a certain column is alternated with red, blue, red, and blue in the column direction when viewed in a plan view, and in the column adjacent in the transverse direction (row direction), the stripe arrangement is only that of green, green, green, green, and green (see FIG. 20). As described above, also in the present embodiment, the arrangement of colors in a PenTile arrangement is performed. However, unlike Embodiment 4, the columnar spacer 40 is replaced with the pixel array portion (that is, pixel array portion X) in which pixels of different colors are disposed in the column direction.

In the present embodiment, the light in the first wavelength band is green light, one of the light in the second wavelength band and the light in the third wavelength band is red light, and the other is blue light. That is, the first pixel Px1 is a green pixel, one of the second pixel Px2 and the third pixel Px3 is a red pixel, and the other is a blue pixel.

The first pixel Px1 (green pixel) has the first color filter layer 611 for transmitting the light in the first wavelength band (green light) (see FIG. 21). The first color filter layer 612 of another adjacent first pixel Px1 (green pixel) is present around the second contact hole 77 as a transmission portion in addition to the first color filter layer 611 (see FIG. 21). The first color filter layer 612 transmits the light (green light) at the first wavelength band that is the same as that of the first color filter layer 611. The aspect corresponds to Aspect (i) in which a layer for transmitting another light is not provided around the second contact hole 77. Like Embodiment 1 and the like, the second color filter layer 62 of the first pixel Px1 transmits light (green light) at the same first wavelength band as the first color filter layers 611 and 612.

In the pixel array portion Y, the second color filter layer 62, which is disposed in the second contact hole 77, and the first color filter layer 61, which is disposed around the second contact hole 77, (611 or 612 in FIG. 21) transmit the light in the same wavelength band. In this case, in the first pixel Px1, since it is not demanded to shield the light in the second contact hole 77, a width of the light shielding layer overlapping the second contact hole 77 in the first pixel Px1 can be reduced, and the light shielding layer itself can be not demanded. Therefore, it is preferable that the first pixel Px1 does not have a light shielding layer having a long diameter of 5 μm or greater when viewed in a plan view, at a position overlapping the second contact hole 77 when viewed in a plan view. Among them, it is more preferable that the light shielding layer is not provided at a position overlapping the second contact hole 77 when viewed in a plan view.

Figure 28:
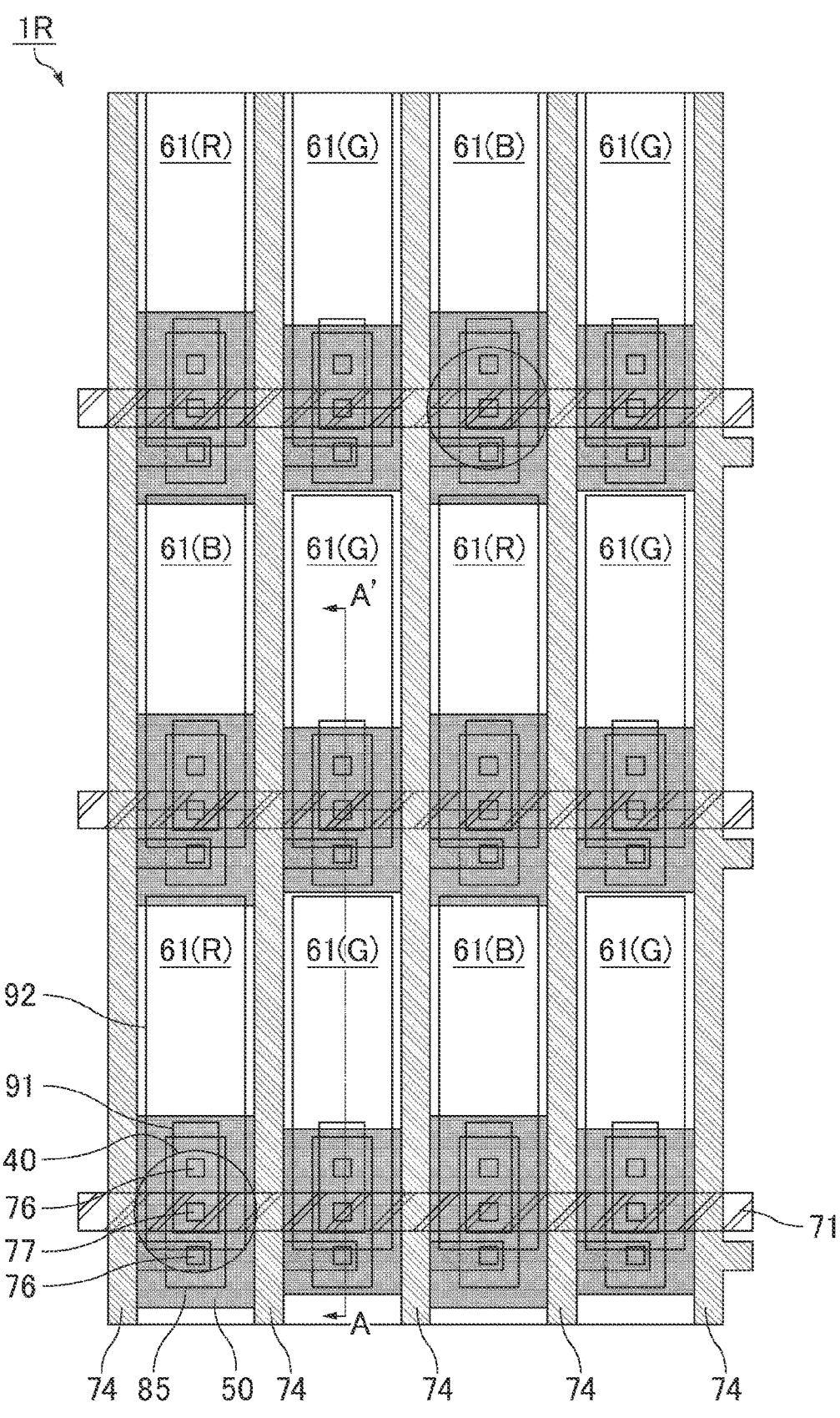
FIG. 28 is an enlarged schematic plan view illustrating a part of pixels of a liquid crystal panel including an active matrix substrate according to the comparative embodiment.
Figure 29:
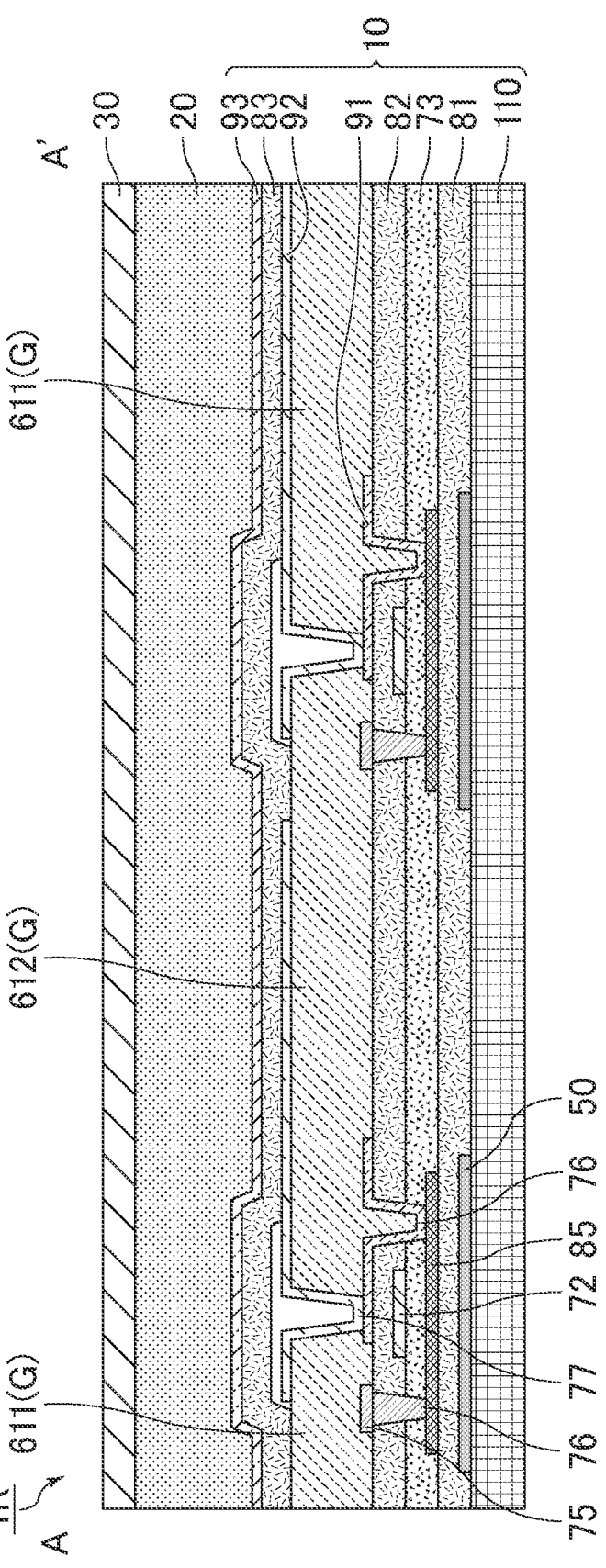
FIG. 29 is a cross-sectional view taken along line A-A' in FIG. 28 as a cut surface (cross-sectional view taken along line A-A').

In this case, in the pixel of the related art, the second color filter layer 62 is not provided in the second contact hole 77 (for example, see FIGS. 28 and 29). FIG. 28 is an enlarged schematic plan view illustrating a part of pixels of a liquid crystal panel including an active matrix substrate corresponding to the pixel in the related art, and FIG. 29 is a cross-sectional view taken along line A-A' in FIG. 28 as a cut surface (cross-sectional view taken along line A-A'). In the active matrix substrate 10R of the comparative embodiment, generally, the inside of the second contact hole 77 is empty or filled with a filler such as an organic film, so that it is demanded to sufficiently provide the light shielding layer 50 such that the light is not incident on the second contact hole 77 (see FIGS. 28 and 29). In this case, the second contact hole 77 cannot be completely used as the transmission portion, and thus the pixel aperture ratio is reduced.

The active matrix substrate 10R illustrated in FIGS. 28 and 29 is an example in which positions of the pixel arrangement and the columnar spacer 40 are disposed in the same positions as the present embodiment such that comparison is made easy with the present embodiment.

In addition, it is desirable that the first pixel Px1 (green pixel) does not have a columnar spacer having a long diameter of 3 μm or greater when viewed in a plan view. Among them, it is more desirable that the columnar spacer is not provided. Also in the present embodiment, the first pixel Px1 does not have the columnar spacer 40 and the light shielding layer 50 (see FIGS. 20 and 21).

In the second pixel Px2 and the third pixel Px3, the first color filter layer 61 transmits the light in the second wavelength band or the light in the third wavelength band, but the second color filter layer 62 transmits the light in the same wavelength band (green light) as the second color filter layer 62 of the first pixel Px1 in any pixel. In order to suppress chromaticity shift and color mixture, the second pixel Px2 and the third pixel Px3 include the light shielding layer 50 at a position overlapping the second contact hole 77 when viewed in a plan view (see FIG. 20). The second pixel Px2 and the third pixel Px3 also include the columnar spacer 40 to easily control a thickness of the liquid crystal layer 20 (see FIG. 20).

Embodiment 6

In the present embodiment, a feature unique to the present embodiment will be mainly described, and description of contents overlapping with those of Embodiment 1 will be omitted. The present embodiment is substantially the same as Embodiment 1 except that the flattening layer 86 is provided between the first color filter layer 61 and the pixel electrode 92.

Figure 22:
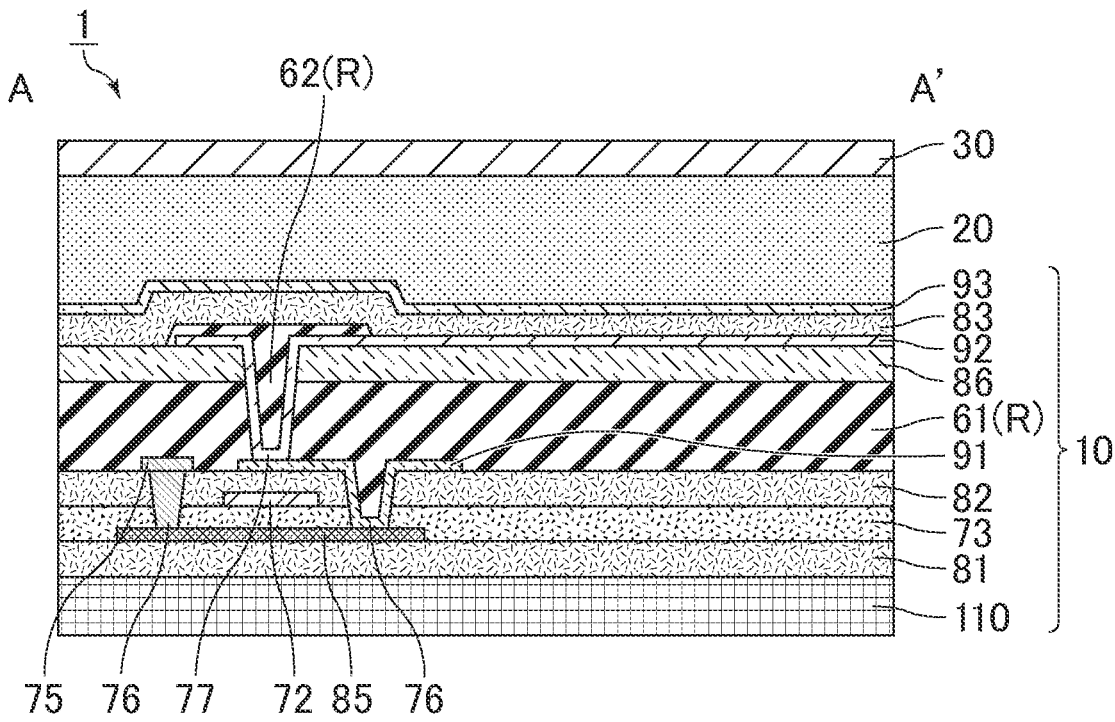
FIG. 22 is a cross-sectional view taken along line A-A' in FIG. 3 as a cut surface (cross-sectional view taken along line A-A') in regard to Embodiment 6.

FIG. 3 is also an enlarged schematic plan view illustrating a part of pixels of the liquid crystal panel 1 including the active matrix substrate 10 according to an example of the present embodiment. FIG. 22 is a cross-sectional view taken along line A-A' in FIG. 3 as a cut surface (cross-sectional view taken along line A-A'), and corresponds to a cross-sectional view of the first pixel Px1.

In the active matrix substrate 10, each pixel Px may further include the flattening layer 86 between the first color filter layer 61 and the pixel electrode 92. The second color filter layer 62 is formed through the first color filter layer 61 and the flattening layer 86 (see FIG. 22). In the present embodiment, although only the cross-sectional view of the first pixel Px1 is illustrated as FIG. 22, the second pixel Px2 and the third pixel Px3 may be also provided with the flattening layer 86 between the first color filter layer 61 and the pixel electrode 92.

The first color filter layer 61 and the second color filter layer 62 tend to be uneven due to material properties, and surfaces thereof are likely to have irregularities. Therefore, for example, when the pixel electrode 92 is formed on the first color filter layer 61 that is not flat, a thickness of the liquid crystal layer 20 (that is, cell gap) is uneven when the active matrix substrate 10 and the counter substrate 30 are bonded to each other, resulting in deterioration of display quality. However, when the flattening layer 86 is provided between the first color filter layer 61 and the pixel electrode 92, the flattening layer 86 covers the first color filter layer 61, so that a base on which the pixel electrode 92 is formed is flattened, and thus the deterioration of display quality is sufficiently suppressed.

When the active matrix substrate 10 of the present embodiment is manufactured, the first color filter layer 61 of the second contact hole 77 is formed by the above (1-2) step, which has been described in detail in Embodiment 1, the flattening layer 86 is formed, and then a contact hole is formed in the flattening layer 86 overlapping the second contact hole 77. Alternatively, in the above (1-2) step, after the first color filter layer 61 is formed, the flattening layer 86 may be formed, and then an opening portion may be formed in a region serving as a later contact hole (second contact hole 77) by the photolithography step. After the second contact hole 77 is formed in the flattening layer 86 as described above, the active matrix substrate 10 can be manufactured by the same method as the manufacturing method described in detail in Embodiment 1.

Embodiment 7

In the present embodiment, a feature unique to the present embodiment will be mainly described, and description of contents overlapping with those of Embodiment 1 will be omitted. The present embodiment is substantially the same as Embodiment 1 except that the shape of the second contact hole 77 is different.

Figure 23:
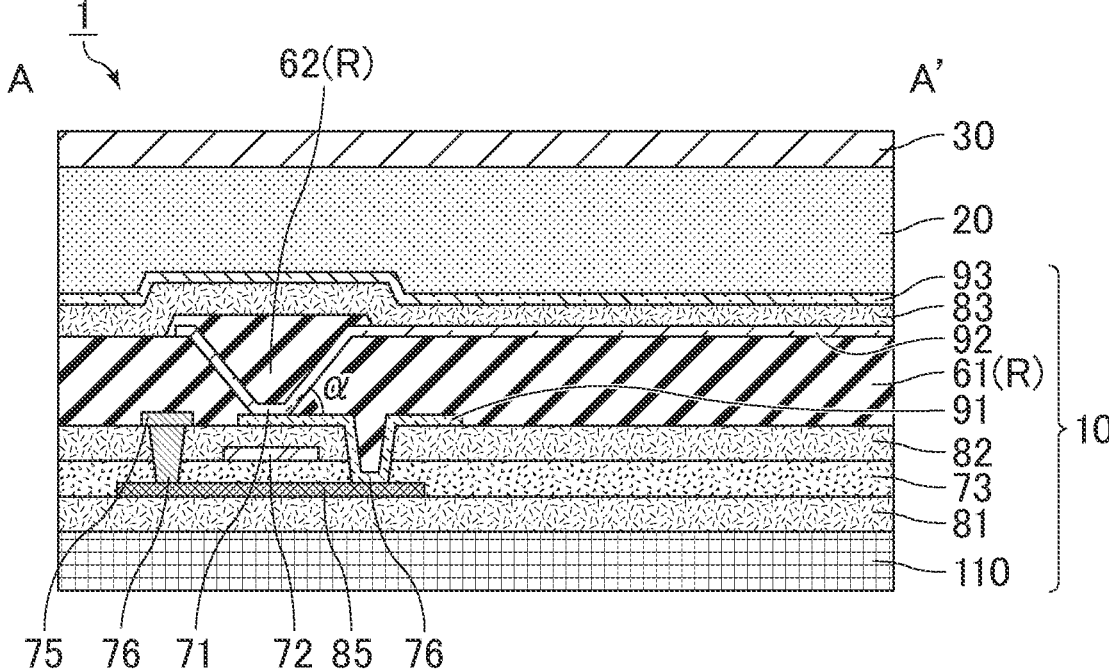
FIG. 23 is a cross-sectional view taken along line A-A' in FIG. 3 as a cut surface (cross-sectional view taken along line A-A') in regard to Embodiment 7.

FIG. 3 is also an enlarged schematic plan view illustrating a part of pixels of the liquid crystal panel 1 including the active matrix substrate 10 according to an example of the present embodiment. FIG. 23 is a cross-sectional view taken along line A-A' in FIG. 3 as a cut surface (cross-sectional view taken along line A-A'), and corresponds to a cross-sectional view of the first pixel Px1.

In the active matrix substrate 10, the second contact hole 77 of the first pixel Px1 has an inclination angle α of the side surface thereof is 45° or less with respect to the main surface of the support substrate 110. Accordingly, the second contact hole 77 is easily filled with the second color filter layer 62. In addition, the second color filter layer 62 disposed in the second contact hole 77 is difficult to swell, so that a step difference on the surface of the active matrix substrate 10 is reduced, and smoothness is further enhanced.

In this case, the inclination angle of the side surface of the second contact hole 77 is reduced, so that an opening area of an upper surface of the second contact hole 77 is increased. However, in the present embodiment, since the second contact hole 77 is also a region for transmitting the light, the pixel aperture ratio can be maintained high even if the opening area of the upper surface of the second contact hole 77 is increased.

In order to form the second contact hole 77 having the above shape, for example, in the above step (1-2) described in detail in Embodiment 1, after the first color filter layer 61 is formed, a mask, which has an opening shape serving as the second contact hole 77, is formed on the first color filter layer 61. Then, a part of the first color filter layer 61 is etched using the mask by isotropic etching or by etching conditions under the etching rate in the lateral direction, which is higher than that in the vertical direction, thereby forming the second contact hole 77. For the etching, dry etching or wet etching can be used.

Although the inclination angle α of the side surface of the second contact hole 77 of the first pixel Px1 has been described, the inclination angle α of the side surface of the second contact hole 77 of the second pixel Px2 may be 45° or less with respect to the main surface of the support substrate 110, or the inclination angle α of the side surface of the second contact hole 77 of the third pixel Px3 may be 45° or less with respect to the main surface of the support substrate 110.

The embodiments of the present disclosure have been described above, and the individual matters described above can be all applied to the present disclosure as a whole.

The present disclosure will be described in more detail with reference to the examples, but the present disclosure is not limited to these examples.

Example 1

A liquid crystal panel corresponding to Embodiment 1 is manufactured (see FIGS. 1 to 6). More specifically, the active matrix substrate 10, which is manufactured according to the following method (a), and a counter substrate 30, which is manufactured according to the following method (b), are bonded to each other, and a liquid crystalline composition (liquid crystal layer 20) is injected thereto, and then a substrate is divided to manufacture a liquid crystal panel 1. Alignment films (not illustrated) are disposed on the surfaces of the active matrix substrate 10 and the counter substrate 30, which are in contact with the liquid crystal layer 20, respectively.

(a) Method for Manufacturing Active Matrix Substrate 10

A conductive film (tungsten film, 50 nm thick) is formed on a support substrate 110, and the conductive film is processed into a desired shape by a photolithography step. The conductive film is not provided on a portion where the second contact hole 77 is provided in a region serving as the first pixel Px1 when viewed in a plan view. The conductive film serves as a light shielding layer 50.

Next, a first insulating film 81 (laminated structure of $SiO_2$ (100 nm thick)/SiN (70 nm thick)) is formed.

Next, a semiconductor film 85 (oxide semiconductor (IGZO), 50 nm thick) is formed, and the semiconductor film is processed into a desired shape by the photolithography step.

Next, a gate insulating film 73 ($SiO_2$, 85 nm thick) is formed.

Next, a conductive film (laminated structure of Ti (100 nm thick)/Al (150 nm thick)/Ti (30 nm thick)) is formed, and the conductive film is processed into a desired shape by the photolithography step. The conductive film serves as a gate electrode 72.

Next, a second insulating film 82 ($SiO_2$, 500 nm thick) is formed, and the insulating film 82 existing in a region serving as the first contact hole 76 is removed by the photolithography step.

Next, a conductive film (laminated structure of Ti (60 nm thick)/Al (300 nm thick)/Ti (20 nm thick)) is formed, and the conductive film is processed into a desired shape by the photolithography step. The conductive film serves as a source line 74 and a source electrode 75.

Next, a first transparent electrode 91 (IZO, 100 nm thick) is formed, and the transparent electrode 91 is patterned by the photolithography step.

Next, a color filter material (photosensitive resin film, 1000 nm thick) is formed, and the material existing in a region serving as the second contact hole 77 is removed by the photolithography step. This is performed with the CF materials of red, green, and blue, respectively, to form a first color filter layer 61 of each color on a portion corresponding to the red, green, or blue pixels.

Next, a second transparent electrode 92 (IZO, 100 nm thick) is formed, and the transparent electrode 92 is patterned by the photolithography step. The transparent electrode 92 serves as a pixel electrode.

Next, a color filter material (photosensitive resin film, 1000 nm thick) is formed, and the second contact hole 77 is filled with the second color filter layer 62 by remaining the material only in the second contact hole 77 through the photolithography step.

Next, a third insulating film 83 (SiN, 100 nm thick) is formed.

Next, a third transparent electrode 93 (IZO, 100 nm thick) is formed, and the transparent electrode 93 is patterned by the photolithography step. The transparent electrode 93 serves as a common electrode.

(b) Method for Manufacturing Counter Substrate 30

Alight shielding resin film (1000 nm thick) is formed on the glass substrate, and is processed into a desired shape by the photolithography step. Thereafter, a columnar spacer 40 is manufactured at a position overlapping the second contact hole 77 of the third pixel Px3.

In the liquid crystal panel in the present example, the first pixel Px1 is a red pixel, the second pixel Px2 is a green pixel, and the third pixel Px3 is a blue pixel. That is, the first color filter layer 61 of the first pixel Px1 is referred to as a red color filter layer 61 (R), the first color filter layer 61 of the second pixel Px2 is referred to as a green color filter layer 61 (G), the first color filter layer 61 of the third pixel Px3 is referred to as a blue color filter layer 61 (B), and the second color filter layer 62 of the pixels Px is referred to as a red color filter layer 62 (R) (see FIGS. 3 to 6). The first pixel Px1 (red pixel) does not have the columnar spacer 40 and the light shielding layer 50 (see FIGS. 3 and 4).

Example 2

A liquid crystal panel corresponding to Embodiment 2 is manufactured by the same procedure as Example 1 (see FIGS. 9 to 12).

In the liquid crystal panel in the present example, the first pixel Px1 is a green pixel, the second pixel Px2 is a red pixel, and the third pixel Px3 is a blue pixel. That is, the first color filter layer 61 of the first pixel Px1 is referred to as a green color filter layer 61(G), the first color filter layer 61 of the second pixel Px2 is referred to as a red color filter layer 61(R), the first color filter layer 61 of the third pixel Px3 is referred to as a blue color filter layer 61(B), and the second color filter layer 62 of the pixels Px is referred to as a green color filter layer 62(G) (see FIGS. 9 to 12). The first pixel Px1 (green pixel) does not have the columnar spacer 40 and the light shielding layer 50 (see FIGS. 9 and 11).

Example 3

A liquid crystal panel corresponding to Embodiment 3 is manufactured by the same procedure as Example 1 (see FIGS. 13 to 16).

In the liquid crystal panel in the present example, the first pixel Px1 is a blue pixel, the second pixel Px2 is a green pixel, and the third pixel Px3 is a red pixel. That is, the first color filter layer 61 of the first pixel Px1 is referred to as a blue color filter layer 61(B), the first color filter layer 61 of the second pixel Px2 is referred to as a green color filter layer 61(G), the first color filter layer 61 of the third pixel Px3 is referred to as a red color filter layer 61(R), and the second color filter layer 62 of the pixels Px is referred to as a blue color filter layer 62(B) (see FIGS. 13 to 16). The first pixel Px1 (blue pixel) does not have the columnar spacer 40 and the light shielding layer 50 (see FIGS. 13 and 16).

Example 4

A liquid crystal panel corresponding to Embodiment 4 is manufactured by the same procedure as Example 1 (see FIGS. 17 to 19). In addition, the arrangement of colors is the PenTile arrangement. The columnar spacer 40 is formed at the position overlapping the second contact hole 77 of the third pixel Px3 (green pixel) (see FIGS. 17 and 19).

In the liquid crystal panel of the present example, one of the first pixel Px1 and the second pixel Px2 is a red pixel, the other is a blue pixel, and the third pixel Px3 is a green pixel. That is, among the first color filter layers of the first pixel Px1 or the second pixel Px2, one color filter layer 61 or 611 is referred to as a red color filter layer 61(R) or 611(R), the other color filter layer 61 or 612 is referred to as a blue color filter layer 61(B) or 612(B), the first color filter layer 61, 611 or 612 of the third pixel Px3 is referred to as a green color filter layer 61(G), 611(G), or 612(G), and the second color filter layer 62 of the pixels Px is referred to as a red color filter layer 62(R) (see FIGS. 17 to 19). The first pixel Px1 and the second pixel Px2 do not have the columnar spacer 40 (see FIGS. 17 and 18). In addition, between the first pixel Px1 and the second pixel Px2, the light shielding layer 50 is reduced only by a portion disposed in the pixel region including the color filter layer 611(R) (see FIG. 18).

Example 5

A liquid crystal panel corresponding to Embodiment 5 is manufactured by the same procedure as Example 1 (see FIGS. 20 and 21). With the proviso that, the arrangement of colors is the PenTile arrangement. The columnar spacer 40 is formed at the position overlapping the second contact hole 77 of the second pixel Px2 and/or third pixel Px3 (see FIG. 20).

In the liquid crystal panel of the present example, the first pixel Px1 is a green pixel, one of the second pixel Px2 and the third pixel Px3 is a red pixel, and the other is a blue pixel. That is, the first color filter layer 61, 611, and 612 of the first pixel Px1 are referred to as green color filter layer 61(G), 611(G), and 612(G), respectively, among the first color filter layers of the second pixel Px2 or the third pixel Px3, one color filter layer 61 or 611 is referred to as a red color filter layer 61(R), the other color filter layer 61 is referred to as a blue color filter layer 61(B), and the second color filter layer 62 of the pixels Px is referred to as a green color filter layer 62(G) (see FIGS. 20 and 21). The first pixel Px1 (green pixel) does not have the columnar spacer 40 and the light shielding layer 50 (see FIGS. 20 and 21).

In the liquid crystal panels of Examples 1 to 5, the aperture ratio of the first pixel Px1 is high (in the liquid crystal panel of Example 4, the aperture ratio of either the first pixel Px1 or the second pixel Px2 is high), and since a change in tinge of the display is sufficiently suppressed, display quality of the pixel is thus improved. Among them, in the liquid crystal panels of Examples 1 to 3, since the light shielding layer 50 is divided into island shapes, the possibility of defective electrostatic discharge is considered to be sufficiently low.

Each aspect of the present disclosure described above may be appropriately combined without departing from the scope of the present disclosure.

The present disclosure contains subject matter related to that disclosed in Japanese Priority Patent Application JP 2023-032765 filed in the Japan Patent Office on Mar. 3, 2023, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
a support substrate; and
a plurality of pixels located on the support substrate,
wherein each of the plurality of pixels includes:
a thin film transistor;
a first color filter layer;
a contact hole provided in the first color filter layer; and
a pixel electrode electrically coupled to the thin film transistor through the contact hole,
and has a second color filter layer in the contact hole,
the plurality of pixels include a first pixel, and
in the first pixel, the first color filter layer transmits light in a first wavelength band and the second color filter layer transmits the light in the first wavelength band or transmits either the light in the first wavelength band or another light when a layer for transmitting the other light is provided around the contact hole.

2. The active matrix substrate according to claim 1, wherein the plurality of pixels further include a second pixel in addition to the first pixel,
the second pixel includes a light shielding layer that is disposed at a position overlapping the contact hole when viewed in a plan view, and
in the second pixel, the first color filter layer transmits light in a second wavelength band different from the first wavelength band, and the second color filter layer transmits the light in the same wavelength band as the second color filter layer of the first pixel.

3. The active matrix substrate according to claim 1, wherein the plurality of pixels further have a third pixel in addition to the first pixel,
the third pixel includes a columnar spacer and a light shielding layer which are disposed at a position overlapping the contact hole when viewed in a plan view with the contact hole interposed therebetween, and
in the third pixel, the first color filter layer transmits light in a third wavelength band different from the first wavelength band, and the second color filter layer transmits the light in the same wavelength band as the second color filter layer of the first pixel.

4. The active matrix substrate according to claim 1, wherein the first pixel does not have a columnar spacer having a long diameter of 3 μm or greater when viewed in a plan view.

5. The active matrix substrate according to claim 1, wherein the first pixel does not have a light shielding layer at a position overlapping the contact hole when viewed in a plan view, in which a long diameter of the light shielding layer is 5 μm or greater when viewed in a plan view.

6. The active matrix substrate according to claim 1, wherein each of the plurality of pixels further includes a flattening layer between the first color filter layer and the pixel electrode, and
the contact hole is formed through the first color filter layer and the flattening layer.

7. The active matrix substrate according to claim 1, wherein the pixel electrode is located above the first color filter layer.

8. The active matrix substrate according to claim 1, wherein a side surface of the contact hole is inclined at an angle of 45° or less with respect to a main surface of the support substrate.

9. The active matrix substrate according to claim 1, wherein each of the plurality of pixels further includes a lead-out electrode which is led out from the thin film transistor to an outside and electrically couples the thin film transistor and the pixel electrode,
the thin film transistor and the lead-out electrode are covered with the first color filter layer, and
the contact hole is located above the lead-out electrode.

10. The active matrix substrate according to claim 1, wherein the contact hole is located above the thin film transistor.

11. The active matrix substrate according to claim 1, wherein each of the plurality of pixels further includes an insulating film and a common electrode on the pixel electrode.

12. A liquid crystal display device comprising:
the active matrix substrate according to claim 1;
a counter substrate; and
a liquid crystal layer located between the active matrix substrate and the counter substrate.

13. A head mounted display device comprising:
the active matrix substrate according to claim 1;
a counter substrate; and
a liquid crystal layer located between the active matrix substrate and the counter substrate.

14. A method for manufacturing the active matrix substrate according to claim 1, which is performed in each of a plurality of pixel regions, the method comprising, in order:
(1) forming a thin film transistor;
(2) forming a first color filter layer having a contact hole;
(3) forming a pixel electrode; and
(4) forming a second color filter layer in the contact hole.

* * * * *